US012772396B2

(12) United States Patent
Kister et al.

(10) Patent No.: US 12,772,396 B2
(45) Date of Patent: Oct. 20, 2026

(54) SUPPORTS FOR BENDABLE AUTO INTERIOR COVER MATERIALS

(71) Applicant: CORNING INCORPORATED, Corning, NY (US)

(72) Inventors: Evan Gray Kister, Painted Post, NY (US); Jason Scott Stewart, Hornell, NY (US)

(73) Assignee: Corning Incorporated, Corning, NY (US)

(*) Notice: Subject to any disclaimer, the term of this patent is extended or adjusted under 35 U.S.C. 154(b) by 101 days.

(21) Appl. No.: 18/709,708

(22) PCT Filed: Nov. 7, 2022

(86) PCT No.: PCT/US2022/049074
§ 371 (c)(1),
(2) Date: May 13, 2024

(87) PCT Pub. No.: WO2023/091318
PCT Pub. Date: May 25, 2023

(65) Prior Publication Data

US 2025/0008674 A1 Jan. 2, 2025

Related U.S. Application Data

(60) Provisional application No. 63/281,284, filed on Nov. 19, 2021.

(51) Int. Cl.
*H05K 5/02* (2006.01)
*B60K 35/22* (2024.01)
(Continued)

(52) U.S. Cl.
CPC ......... *H05K 5/0226* (2013.01); *B60K 35/223* (2024.01); *B60K 35/53* (2024.01); *H05K 5/03* (2013.01); *B60K 35/22* (2024.01)

(58) Field of Classification Search
CPC .......................... H05K 5/0217; H05K 5/0017
(Continued)

(56) References Cited

U.S. PATENT DOCUMENTS 11,116,098 B2 9/2021 Gross et al.
11,772,361 B2 10/2023 Hawtof et al.
(Continued)

FOREIGN PATENT DOCUMENTS

CN 205935250 U 2/2017
CN 212613241 U 2/2021
(Continued)

OTHER PUBLICATIONS

International Search Report and Written Opinion of the International Searching Authority; PCT/US2022/049074; mailed on Mar. 15, 2023, 12 pages; European Patent Office.

*Primary Examiner* — Hung S. Bui
(74) *Attorney, Agent, or Firm* — Daniel J. Greenhalgh

(57) ABSTRACT

A display assembly for an automotive interior includes a cover substrate comprising a first major surface and a second major surface opposite the first major surface; and a support structure. The support structure comprises a plurality of frame portions adhered to separate regions of the second major surface via an adhesive layer to retain the cover substrate in a curved configuration. A shear joint couples two of the plurality of frame portions to one another, the shear joint being configured to maintain a mechanical connection between the two frame portions despite bending stresses being present in the cover substrate, while permitting the two frame portions to move relative to one another along at least a first axis. A gap in the adhesive layer is disposed proximate to the shear joint, the gap decoupling thermally-induced strain distributions of different segments of the adhesive layer from one another via the shear joint.

17 Claims, 10 Drawing Sheets

(51) Int. Cl.
*B60K 35/53* (2024.01)
*H05K 5/03* (2006.01)

(58) Field of Classification Search
USPC .......................................................... 361/807
See application file for complete search history.

(56) References Cited

U.S. PATENT DOCUMENTS

| | | | | |
|---|---|---|---|---|
| 2009/0155555 | A1* | 6/2009 | Botelho | C03C 8/14 428/210 |
| 2019/0012033 | A1 | 1/2019 | Brandao Salgado et al. | |
| 2019/0106357 | A1* | 4/2019 | Dejneka | B32B 27/08 |
| 2019/0315648 | A1 | 10/2019 | Kumar et al. | |
| 2019/0329531 | A1 | 10/2019 | Brennan et al. | |
| 2019/0346887 | A1* | 11/2019 | Park | G06F 1/1652 |
| 2020/0199019 | A1* | 6/2020 | Dejneka | C03C 21/002 |
| 2020/0407268 | A1* | 12/2020 | Mitchell | C03B 32/02 |
| 2020/0413550 | A1* | 12/2020 | Kuo | G02F 1/13336 |
| 2021/0089076 | A1 | 3/2021 | Stegemann et al. | |
| 2021/0265450 | A1* | 8/2021 | Oh | H10K 59/1216 |
| 2021/0308986 | A1 | 10/2021 | Hawtof et al. | |
| 2022/0234447 | A1 | 7/2022 | Benjamin et al. | |
| 2022/0250475 | A1 | 8/2022 | Buth et al. | |
| 2023/0202300 | A1 | 6/2023 | Badar et al. | |

FOREIGN PATENT DOCUMENTS

| | | | | | |
|---|---|---|---|---|---|
| CN | 113314569 | A | * | 8/2021 | H10K 59/87 |
| WO | 2020/236457 | A1 | | 11/2020 | |
| WO | 2020/257380 | A1 | | 12/2020 | |

* cited by examiner

SUPPORTS FOR BENDABLE AUTO INTERIOR COVER MATERIALS

PRIORITY

This is a U.S. National Stage Application under 35 U.S.C. § 371 of International Patent Application PCT/US2022/049074 filed on Nov. 7, 2022, which claims the benefit of priority under 35 U.S.C § 119 of U.S. Provisional Application Ser. No. 63/281,284 filed Nov. 19, 2021, the content of each of which is relied upon and incorporated herein by reference in its entirety.

TECHNICAL FIELD

This document pertains generally, but not by way of limitation, to support structures for supporting cold-formed cover substrates in non-planar configurations. The support structures include shear joints providing degrees of freedom for distributing thermally-induced and bending-induced shear stresses in an adhesive layer attaching the support structure to the cover substrate.

BACKGROUND

Automotive interior systems can include surfaces that incorporate displays and/or touch panels and cover substrates disposed over the displays and/or touch panels. There is a desire to change the shape of the surfaces and, in particular, to dynamically change the shape of the surface according to the needs or preferences of a viewer, such as a driver or a passenger. Such dynamic changes in the display may involve movement of various portions of the display relative to one another. Such dynamic movements may induce shear stresses in the systems that may potentially lead to mechanical failure of components of the display (e.g., delamination of the components from one another). Risk of component failure may be further exacerbated by the thermal conditions that automotive interior components are exposed to (e.g., thermal cycling between temperatures ranging from −30° C. to 60° C.). Bending-induced shear stresses may combine with thermally-induced shear stresses to render component failure particularly likely. Accordingly, a need exists for a dynamically bendable displays with structures designed to manage bending and thermally induced shear stresses to improve reliability.

OVERVIEW

Embodiments of the present disclosure provide display assemblies including support structures for dynamically bendable cover substrates. The support structures are designed to mitigate shear stresses in an adhesive layer attaching the cover substrate to the support structure that may result from thermal expansion/contraction of the cover substrate and support structure and/or bending the cover substrate. The support structures according to the present disclosure may include one or more shear joints for mitigating the shear stress. The shear joints may connect different components of the support structure to one another and provide at least one degree of freedom whereby the connected components may move relative to one another in order to alleviate shear stresses that may be present in the display. For example, in embodiments, the display comprises a frame including a support surface and a cover substrate adhered to the support surface via an adhesive layer. In embodiments, the one or more shear joints may couple different frame portions of the frame to one another and coincide with a gap devoid of adhesive of the adhesive layer. As a result, the adhesive layer is separated into different portions on either side of the shear joint, decoupling thermally-induced shear stresses of each portion of the adhesive layer from one another, thereby lowering maximum thermally-induced shear stresses present in the adhesive and lowering the likelihood of component failure.

In embodiments, the display assemblies of the present disclosure include a cover substrate with a dynamic bending portion that changes in shape as the display is manipulated into different configurations. In such embodiments, the display may include one or more retained portions that are retained in shape by the frame, irrespective of the shape of the dynamic bending portion. For example, in embodiments, the frame includes a first frame portion attached to a first portion of the cover substrate and configured to retain the first portion of the cover substrate in a first fixed shape. In such embodiments, the frame may also include a second frame portion attached to a second portion of the cover substrate and configured to retain the second portion of the cover substrate in a second fixed shape. The first and second frame portions of the frame may be attached to a major surface of the cover substrate via an adhesive layer. The dynamic bending portion may extend between the first and second portions of the cover substrate and be attached to a central portion of the frame. The central portion of the frame may be attached to the first frame portion and the second frame via one or more shear joints. The one or more shear joints may beneficially prevent bending-induced shear stress resulting from bending of the dynamic bending portion of the cover substrate from being transferred to portions of adhesive of the adhesive layer attaching the first and second frame portions of the frame to the first and second portions of the glass substrate. Such a structure beneficially aids in reducing the overall stress within the adhesive layer, rendering the displays according to the present disclosure less prone to mechanical failure and more reliable.

In one embodiment, A display assembly for an automotive interior includes a cover substrate comprising a first major surface and a second major surface opposite the first major surface; and a support structure. The support structure comprises a plurality of frame portions adhered to separate regions of the second major surface via an adhesive layer to retain the cover substrate in a curved configuration. A shear joint couples two of the plurality of frame portions to one another, the shear joint being configured to maintain a mechanical connection between the two frame portions despite bending stresses being present in the cover substrate, while permitting the two frame portions to move relative to one another along at least a first axis. A gap in the adhesive layer is disposed proximate to the shear joint, the gap decouplingthermally-induced strain distributions of different segments of the adhesive layer from one another via the shear joint.

In another embodiment, a display assembly for an automotive interior includes a cover substrate comprising a first major surface and a second major surface opposite the first major surface and a support structure. The support structure includes a frame attached to the second major surface of the cover substrate via an adhesive layer. The frame includes a first frame portion adhered to a first portion of the cover substrate and retaining the first portion in a first fixed shape; and a second frame portion adhered to a second portion of the cover substrate and retaining the second portion in a second fixed shape, wherein the cover substrate comprises a dynamically bending portion extending between the first frame portion and the second frame portion. The frame also includes a central portion attached to the second major surface at a dynamic bending portion of the cover substrate; a first shear joint connecting a first edge of the central portion to the first frame portion, the first shear joint permitting the central portion to move along a first axis relative to the first frame portion while maintaining a connection between the first frame portion and the central portion as the cover substrate is bent in the dynamic bending portion; a second shear joint connecting a second edge of the central portion to the second frame portion, the second shear joint permitting the central portion to move along the first axis relative to the second frame portion while maintaining a connection between the second frame portion and the central portion as the cover substrate is bent in the dynamic bending portion; and an actuator assembly configured to move the first frame portion relative to the second frame portion to bend the cover substrate in the dynamic bending portion.

Another embodiment relates to a method of assembling a display assembly for a vehicle interior system, the method including: depositing an adhesive layer onto a major surface of a cover substrate such that the adhesive layer comprises one or more gaps separating different sections of the adhesive layer; attaching a plurality of portions of a support structure to the major surface via the different sections of the adhesive layer, wherein the plurality of portions of the support structure comprises a first frame portion adhered to a first portion of the cover substrate and configured to retain the first portion of the cover substrate in a first fixed shape and a central portion adhered to a dynamic bending portion of the glass substrate; and attaching the first frame portion to the central portion via a shear joint, the shear joint being configured to maintain a connection between the first frame portion and the central portion while the dynamic bending portion is bent relative to the first portion, while permitting the first frame portion to move relative to the central portion in at least a first direction.

This overview is intended to provide an overview of subject matter of the present patent application. It is not intended to provide an exclusive or exhaustive explanation of the invention. The detailed description is included to provide further information about the present patent application.

Figure 1:
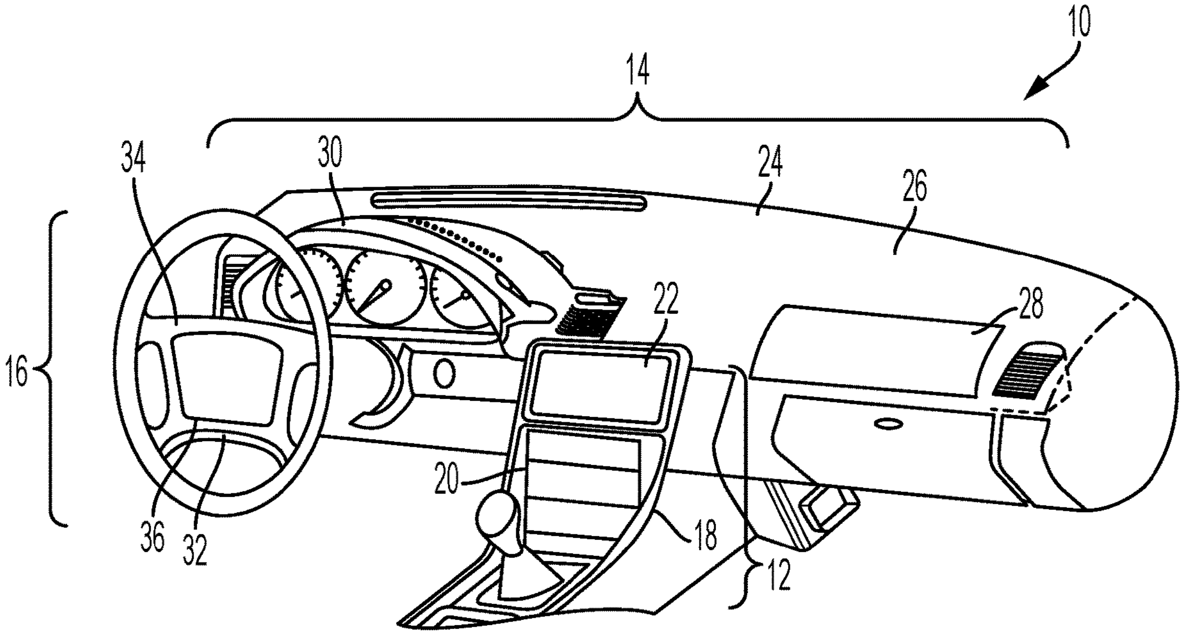
FIG. 1 is a perspective view of a vehicle interior with vehicle interior systems incorporating a dynamically-bendable display, according to one or more embodiments of the present disclosure.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Referring generally to the figures, described herein are various embodiments of display assemblies for automotive interior applications. The display assemblies may include a cover substrate and a support structure configured to retain the cover substrate in a desired configuration, irrespective of bending stresses that may be present in the cover substrate. For example, in embodiments, the support structure is configured to retain the cover substrate in a curved configuration that differs from the equilibrium shape of the cover substrate (e.g., the shape the cover substrate would take if free from the influence of external forces). For example, the support structure may retain the cover substrate in the curved configuration via an adhesive layer attaching a major surface of the cover substrate to the support structure. The support structure may be constructed of a suitable material (e.g., a metallic material, polymeric material, a composite material) to provide sufficient rigidity to retain the cover substrate in the curved configuration despite bending stresses being present in the cover substrate. In embodiments, the support structure includes a coefficient of thermal expansion ("CTE") that differs from that of the cover substrate and, as a result, thermal expansion/contraction of the cover substrate and support structure may induce shear stresses in the adhesive layer. Such thermally-induced shear stresses may lead to delamination or other mechanical failure of the display assembly. Accordingly, the support structure of the present disclosure include one or more shear joints that attach different portions of the support structure to one another, while permitting the portions to move relative to one another along at least a first axis. Such shear joints may be used in conjunction with gaps in the adhesive layer disposed proximate to the shear joints to decouple thermally-induced shear stress distributions in different portions of the adhesive layer from one another, thereby lowering the overall shear stress present in the adhesive layer and improving the reliability of the display assemblies described herein over certain existing designs.

In embodiments, the display assemblies described herein are capable of being manipulated in shape via bending the cover substrate. For example, in embodiments, the support structure may include first and second frame portions attached to first and second portions of the cover substrate, respectively, and be configured to retain the first and second portions in fixed shapes to facilitate attachment of display panels (e.g., LCD display panels, LED display panels, OLED display panels) thereto. The cover substrate may include a dynamic bending portion extending between the first and second portions that may be manipulated in shape via application of an external force thereto, such as via an actuator. In embodiments, the support structure includes a central portion structurally supporting the dynamic bending portion. The one or more shear joints of the support structure may connect the central portion to the first and second frame portions and permit relative movement between the central portion and the first and second portions. Gaps in the adhesive layer attaching the support structure to the cover substrate may be disposed proximate to the shear joints to isolate bending-induced shear stresses to the portion of the adhesive layer bonded to the dynamic bending portion. Portions of the adhesive layer not directly bonded to the dynamic bending portion may not be subjected to bending-induced shearing stress. As a result, the overall shear stress in the adhesive layer may be reduced, especially in portions thereof adjacent the display panels. Such reduced shear stress may improve reliability as well as optical performance, by mitigating stress-induced optical distortions. The support structures of the present disclosure may provide improved reliability and optical performance over certain existing dynamic bending display assemblies.

FIG. 1 shows vehicle interior 10 that includes three different vehicle interior systems 12, 14 and 16 according to various embodiments. Vehicle interior system 12 includes center console base 18 with curved surface 20 including a display, shown as curved display 22. Vehicle interior system 14 includes dashboard base 24 with curved surface 26 including curved display 28. Dashboard base 24 typically includes instrument panel 30 (or center console, not shown) which may also include a curved display. Vehicle interior system 16 includes dashboard steering wheelbase 32 with a curved surface 34 and a curved display 36. In embodiments, the vehicle interior system may include a base that is an arm rest, a pillar, a seat back, a floorboard, a headrest, a door panel, or any portion of the interior of a vehicle that includes a curved surface.

The surfaces and curved surfaces of vehicle interior system 12, 14 and 16 can include various electronic displays. It is desirable for those electronic displays to satisfy headform impact test (HIT) requirements as well as to be repositionable, such as for different sized users or different numbers of users within the vehicle. Moreover, it is desirable that such electronic displays are reliable over the use lifetime of the vehicle interior 10.

Figure 2A:
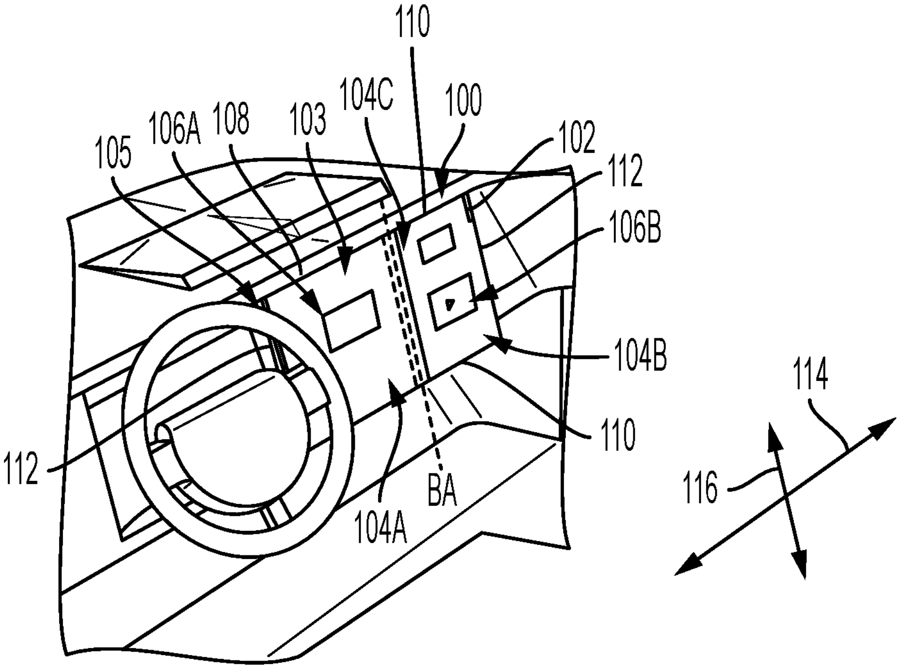
FIG. 2A schematically depicts a dynamically bendable automotive interior display system with a bendable cover substrate in an in-plane or straight configuration, according to one or more embodiments of the present disclosure.
Figure 2B:
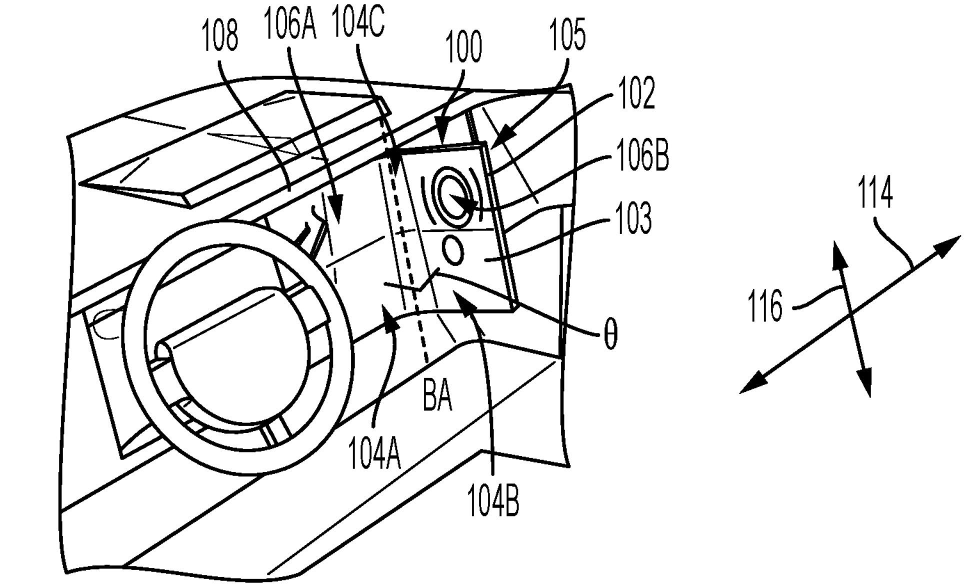
FIG. 2B schematically depicts the dynamically bendable automotive interior display system of FIG. 2A, with the bendable cover substrate in an out-of-plane or bent configuration, according to one or more embodiments of the present disclosure.

FIGS. 2A and 2B show perspective front views of a dynamically bendable automotive interior display system 100 with the cover substrate 102 that is configured to be dynamically bent from a first configuration depicted in FIG. 2A to a second configuration in FIG. 2B. FIG. 2A depicts the dynamically bendable automotive interior display system 100 in an extended position where a major surface 103 (e.g., a first major surface) of the cover substrate 102 is in a substantially flat or planar configuration. In such a configuration, first display electronics 106A and second display electronics 106B—adhered to a second major surface (not depicted) of the cover substrate 102 in the depicted embodiment—lie substantially in the same plane and are viewable by passengers of the vehicle, with the second display electronics 106B functioning as a central stack display. FIG. 2B depicts the dynamically bendable automotive interior display system 100 in a deployed or deflected configuration, where the major surface 103 is curved or bent such that the first display electronics 106A and the second display electronics 106B do not lie in the same plane (e.g., such that the normal directions of the different portions of the major surface 103 overlapping the first and second display electronics 106A and 106B extend in non-parallel directions towards the driver's side of the vehicle). Such a configuration may facilitate a driver of the vehicle viewing the entirety of the dynamically bendable automotive interior display system 100 while driving.

As shown in FIG. 2A, system 100 can include a support structure 105 that can be positioned behind the cover substrate 102 to support the cover substrate 102 and the first and second display electronics 106A and 106B. In embodiments, at least a portion of the support structure 105 is adhered to the second major surface (not depicted in FIGS. 2A and 2B) of the cover substrate 102. The support structure 105 may be attached to a component of the vehicle interior system 100, such as the dashboard base 108, so as to retain the dynamically bendable automotive interior display system 100 in a desired position and orientation within the vehicle. The support structure 105 may also provide structural support to the first and second display electronics 106A and 106B and cover substrate 102 to provide desirable HIT performance. In embodiments, the first and second display electronics 106A and 106B include display panels (e.g., LCD display panels, LED display panels, OLED display panels) and associated electrical connections for connecting the display panels to a power source within the vehicle. As such, the support structure 105 may provide mechanical support to the cover substrate 102, while facilitating electronic connections between the first and second display electronics 106A and 106B and an on-board electrical system of the vehicle and facilitating dynamic bending of the cover substrate 102 to place the system 100 in the various configurations described herein.

In the embodiment depicted in FIGS. 2A and 2B, the cover substrate 102 includes a first portion 104A, a second portion 104B, and a dynamic bending portion 104C disposed between the first portion 104A and the second portion 104A. In embodiments, the first and second portions 104A and 104B are retained in fixed shapes (e.g., such that the portions of the major surface 103 therein have the same shape in either of the configurations depicted in FIGS. 2A and 2B) via rigid components of the support structure 105 while the dynamic bending portion 104C is bent to varying degrees around a bending axis BA via application of a force thereto. First display electronics 106A can be adhered to the first portion 104A of the cover substrate 102 on a first side of bend axis BA and the second display electronics 106B can be attached to the second portion 104B on a second side of the bending axis BA. In the depicted embodiment, the bending axis BA is disposed outward from the major surface 103, towards the interior of the vehicle, such that the major surface 103 is concavely bent within the dynamic bending portion 104C when the system 100 is placed into the second configuration. It should be appreciated that alternative embodiments, where the bending axis BA is placed on the opposite side of the cover substrate 102 such that the dynamic portion is convexly bent, are contemplated and within the scope of the present disclosure.

In embodiments, the support structure 105 is constructed such that the dynamic bending portion 104C of the cover substrate 102 maintains a desired geometric shape as the system changes from the configurations depicted in FIGS. 2A and 2B. For example, in embodiments, the support structure 105 is constructed such that the major surface 103 within the dynamic bending portion 104C includes a constant radius of curvature about the bending axis BA, irrespective of the degree to which the cover substrate 102 is bent (e.g., irrespective of the angle at which the major surface 103 in the first portion 104A extends relative to the major surface 103 in the second portion 104B). In embodiments, the support structure 105 is constructed such that the dynamic bending portion 104C includes another desired shape when bent into the various configurations described herein. For example, when placed into the second configuration depicted in FIG. 2B, the major surface 103 may follow a parabolic surface profile and/or possess a radius of curvature that varies as a function of spatial position thereon (e.g., as a function of distance from an inner edge of the first portion 104A). The support structure 105 may also provide structural support to the dynamic bending portion 104C such that the system 100 conforms with HIT regulatory requirements.

As shown in FIG. 2A, when in the first configuration, the cover substrate 102 includes longitudinal edges 110 extending along a first axis 114 and transverse edges 112 extending along a second axis 112. The longitudinal edges 110 may have a first dimension (e.g., a length) along the first axis 114 and the transverse edges 112 may have a second dimension (e.g., a width) along the second axis 116. In embodiments, the support structure 105 includes a frame (not depicted) that is adhered to the cover substrate 102 and substantially coextensive with the cover substrate 102. For example, as described herein, the support structure 105 may include a first frame portion adhered to the first portion 104A, a second frame portion adhered to the second portion 104B, and a flexible support layer adhered to dynamic bending portion 104C, such that the combined dimensions of the portions of the support structure 105 include lengths and widths that are at least 70% (e.g. at least 80%, at least 90%, at least 95%, 100%) of those of the cover substrate 102.

In embodiments, the support structure 105 includes a flexural rigidity that is sufficient to retain the cover substrate 102 in a bent configuration, despite bending stress being present in the cover substrate 102 as a result of the cover substrate 102 being bent from its mechanical equilibrium state. For example, the support structure 105 may be constructed of a suitable material having a Young's modulus that is greater than that of the cover substrate 102. As described herein, in various embodiments, the cover substrate 102 may be constructed of a suitable glass composition, while the support structure 105 may be formed of a metallic material, such as aluminum or stainless steel. The support structure 105 may be adhered to the cover substrate 102 via an adhesive layer of a suitable structural adhesive. The different materials used to construct the support structure 105 and cover substrate 102 may have different coefficients of thermal expansion (CTEs) over the range of operating temperatures of the system 100, resulting in thermally-induced shear stress being placed on the adhesive of the adhesive layer. The magnitude of such thermally-induced shear stress may vary as a function of position within the adhesive layer. The maximum magnitude of the thermally-induced adhesive shear stress may be approximated as $$\tau_{max\ CTE} = \frac{(\alpha_1 - \alpha_2)G\tanh(\beta L)\Delta T}{\beta H} \quad \text{(Equation 1)}$$

where $\tau_{max\ CTE}$ is the maximum thermally-induced adhesive shear stress resulting from the mismatch between the support structure 105 and the cover substrate 102, $\alpha_1$ is the CTE of the support structure 105, $\alpha_2$ is the CTE of the cover substrate 102, G is the shear modulus of the adhesive, L is the total distance from a geometric center of the display assembly 102 (or a distance from a center of a region with continuous CTE properties over which shear stress is being measured), $\Delta T$ is the temperature range the system 100 is subjected to, H is the thickness of the adhesive layer, $E_1$ is the Young's modulus of the support structure 105, $E_2$ is the Young's modulus of the cover substrate 102, $t_1$ is the thickness of the support structure 105, and $$\beta = \sqrt{\left[\frac{G}{H}\left(\frac{1}{E_1 t_1} + \frac{1}{E_2 t_2}\right)\right]}. \quad \text{(Equation 2)}$$

As shown in Equations 1 and 2 above, the maximum thermally-induced shear stress on the adhesive layer varies in proportion to the CTE differential between the cover substrate 102 and the support structure 105, as well as the size of the region over which the shear stress may accumulate. As a result of the CTE mismatch between the support structure 105 and the cover substrate 102 and the relatively large dimensions of the system 100, relatively large CTE-induced stresses may accumulate in the adhesive layer, leading to potential delamination of the support structure 105 from the cover substrate 102 and potential reliability issues.

Risks of mechanical failure of the system 100 may be further exacerbated by the bending of the cover substrate 102 in the dynamic bending portion 104C. For example, the aforementioned thermally-induced shear stresses in the adhesive may be compounded with bending-induced shear stresses. The adhesive in the adhesive layer between the support structure 105 and the cover substrate 102 may be cured with the system 100 in the configuration depicted in FIG. 2A. As a result, the bending of the cover substrate 102 in the dynamic bending portion 104C causes the adhesive layer to deviate from its mechanical equilibrium state. Moreover, the cover substrate 102 and the support structure 105 may be bent about the bending axis BA to different bending radii, placing additional shear stress on the adhesive layer. Such bending-induced shear stress on the adhesive layer may approximated as $$\tau_b = G\frac{\Delta L_b}{H}, \quad \text{(Equation 3)}$$

where $\tau_b$ is the bending induced shear stress, G is the shear modulus of the adhesive, $\Delta L_b$ is the change of length difference between the cover substrate 102 and the support structure 105 (that may vary as a function of the radius of curvature to which the cover substrate 102 is bent in the dynamic bending portion 104C), and His the thickness of the adhesive layer. In embodiments, the shear stress may be approximated as $$\tau_b = G\theta, \quad \text{(Equation 4)}$$

where Θ is the bending angle of the cover substrate 102 (the angle at which the major surface 103 within the first portion 104A extends relative to the major surface 103 within the second portion 104A in the depicted example). The bending angle Θ may represent the amount the cover substrate 102 is caused to vary from its mechanically neutral state (free of bending stresses) by application of force thereto. In embodiments, the bending angle Θ may represent the arc length of the cover substrate 102 that is bent to a desired radius of curvature within the dynamic bending portion 104C.

When the cover substrate 102 is bent within the dynamic bending portion 104C such that the first and second portions 104A and 104B extend at relatively large angles relative to one another (e.g., such that the angle Θ is greater than or equal to 5°, greater than or equal to 10°, greater than or equal to 20°, greater than or equal to 30°, greater than or equal to 40°, greater than or equal to 50°, greater than or equal to 60°, greater than or equal to 70°, greater than or equal to 80°, greater than or equal to) 90°, the aforementioned compounding of the thermally-induced shear stress and the bending-induced shear stress in the adhesive layer may render mechanical failure (e.g., delamination) of the system 100 particularly likely over the use lifetime thereof.

In view of the foregoing, the support structure 105 may include a plurality of frame portions (not depicted in FIGS. 2A and 2B) that are adhered to separate regions of the cover substrate 102. The plurality of frame portions may be attached to one another via one or more shear joints configured to maintain mechanical connections between the frame portions as the cover substrate 102 is bent, while permitting the frame portions to move relative to one another in at least one direction (e.g., along the first axis 114, along the second axis 116). By providing the different frame portions a degree of freedom to move relative to one another in response to thermal expansion/contraction and bending, the shear joints described herein beneficially decouple thermally-induced shear distributions of the portions of the adhesive layer bonded to the various different frame portions from one another. The shear joints effectively lower the L value in Equation 1 for the various portions of the adhesive layer, thereby lowering the maximum thermally-induced shear stress that the adhesive layer is exposed to.

Moreover, in embodiments, the one or more shear joints may be disposed at edges of the dynamic bending portion 104C of the cover substrate 102 and used to isolate bending-induced shear stresses in the region of the adhesive layer bonded to the dynamic bending portion 104C. The degree of freedom provided by the shear joints described herein may prevent bending-induced shear stresses from reaching portions of the support structure 105 that are adhered to the first and second frame portions and to the first and second portions 104A and 104B of the cover substrate 102. As a result, the adhesive bonded to the first and second portions 104A and 104B may not experience bending-induced shear stress. Such lower overall stress experienced by these regions of the adhesive may render the system 100 more reliable and also improve optical performance by limiting distortion caused by stresses that may be transferred to the cover substrate 102 from the support structure 105.

Various example support structures including one or more shear joints will now be described in detail. While these examples described herein pertain to the example system 100 described herein with respect to FIGS. 2A and 2B, it should be understood that the shear joints described herein are usable in contexts other than that particular example. For example, in embodiments, support structures in accordance with the present disclosure may be used as frames for statically cold-forming cover substrates (e.g., such that the cover substrates remain in a bent configuration), as described in, for example, U.S. Pre-Grant Publication No. 2019/0329531 A1, entitled "Laminating thin strengthened glass to curved molded plastic surface for decorative and display cover application," U.S. Pre-Grant Publication No. 2019/0315648 A1, entitled "Cold-formed glass article and assembly process thereof," U.S. Pre-Grant Publication No. 2019/0012033 A1, entitled "Vehicle interior systems having a curved cover glass and a display or touch panel and methods for forming the same," and U.S. patent application Ser. No. 17/214,124, entitled "Curved glass constructions and methods for forming same," which are hereby incorporated by reference in their entireties. The cover substrate 102 may or may not include a dynamic bending portion in various embodiments. In embodiments, the cover substrate 102 is not cold-formed and the shear joints described herein may be used to mitigate thermally-induced adhesive stresses between a cover substrate and a support structure.

It should also be understood that the particular shape of the cover substrate 102 and first and second display electronics 106A and 106B may vary from the example depicted in FIGS. 2A and 2B. The cover substrate 102 may include a variety of different dimensions and be placed at various locations within the vehicle interior system 100 according to the present disclosure. In embodiments, for example, the first portion 104A of the cover substrate 102 may extend over the instrument panel 30 behind the vehicle interior system 16. The present disclosure is not limited to any particular display system or any particular location within a vehicle interior system and may be applied to displays having a variety of sizes and configurations. The shear joints described herein may also find applicability in systems not including display panels. Any structure where a cover substrate is retained in a state with bending stress may incorporate the shear joints described herein to improve reliability.

Figure 3A:
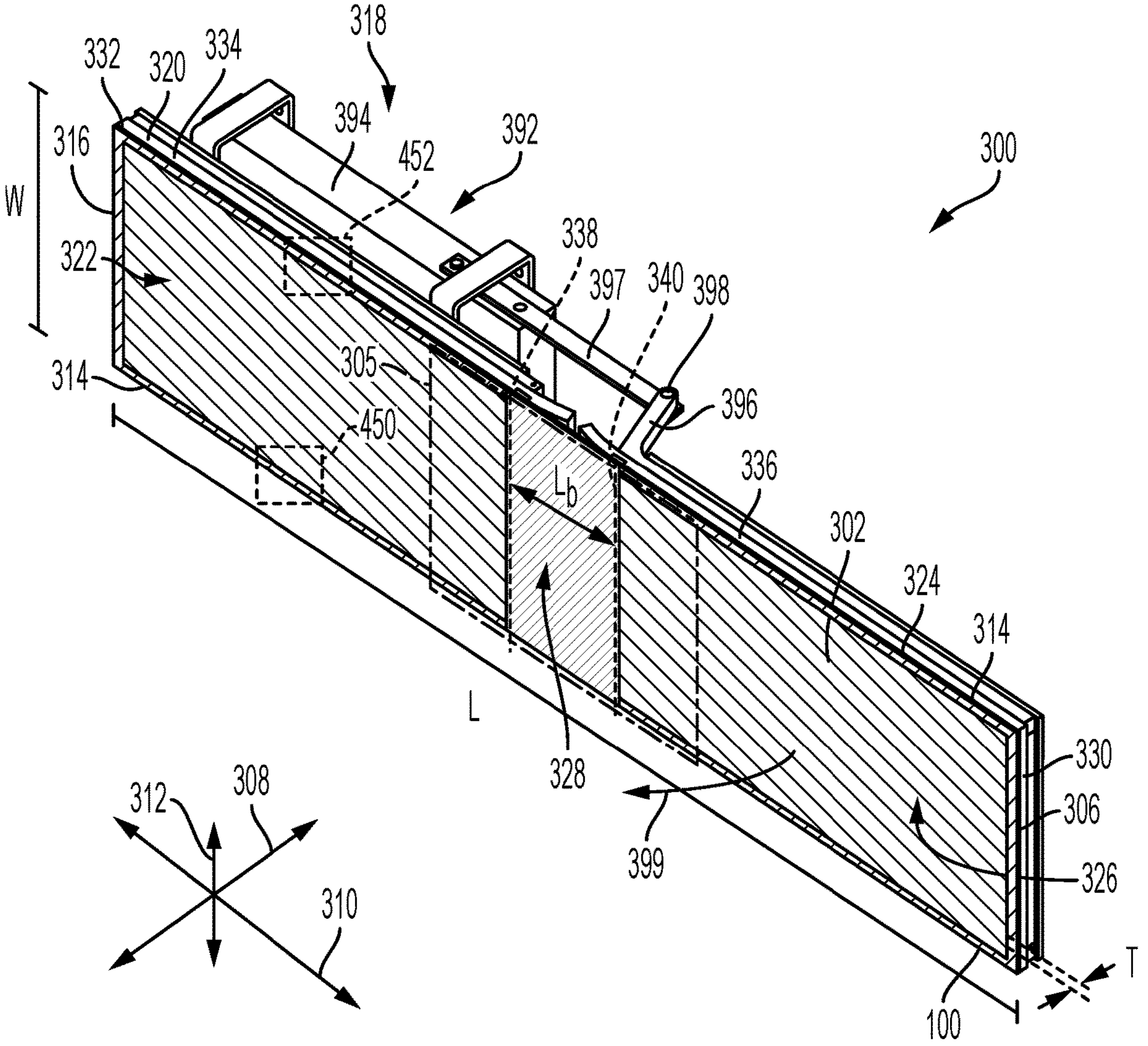
FIG. 3A is a perspective view of a dynamically bendable automotive interior display system including a cover substrate and a support structure with a plurality of shear joints, according to one or more embodiments of the present disclosure.

FIG. 3A depicts a display assembly 300 according to an example embodiment of the present disclosure. The display assembly 300 may be used in an automotive interior system to provide a dynamically bendable automotive interior display system. For example, in embodiments, the display assembly 300 may be used in the system 100 described herein with respect to FIGS. 2A and 2B.

The display assembly 300 in FIG. 3A is depicted to include a cover substrate 302. The cover substrate 302 includes a first major surface 304 and a second major surface 306 opposite the first major surface 304. The cover substrate 302 is depicted to include a thickness T measuring a distance between overlapping positions on the first major surface 304 and the second major surface 306 that are disposed on a line extending in a direction perpendicular to the first major surface 306 at that position. The thickness T may be measured along a first axis 308 extending perpendicular to the first major surface 304 (and the second major surface 306 in some embodiments). In embodiments, FIG. 3A depicts the display assembly 300 in a first configuration where the cover substrate 302 is in a mechanically neutral or relatively low bending stress state. When the display assembly 300 is in the configuration depicted in FIG. 3A, the cover substrate 302 may have a shape corresponding to the shape thereof in the absence of any external forces being applied thereto. In the depicted embodiment, the cover substrate 302 is a planar sheet of material in the first configuration, including a length L measured along a second axis 310 extending perpendicular to the first axis 308 and a width W measured along a third axis 312 extending perpendicular to both the first axis 308 and the second axis 310. The cover substrate 302 is depicted to include longitudinal edges 314 extending along the second axis 310 and transverse edges 316 extending along the third axis 312. Various example embodiments of the cover substrate 302, including composition and dimensions thereof, will be described in greater detail herein.

The display assembly 300 includes a support structure 318 attached to the cover substrate 302. The support structure 318 is generally configured to provide structural support to the cover substrate 302 and retain the cover substrate 302 in a desired shape configuration. For example, in embodiments, the support structure 318 may be configured to retain the cover substrate 302 in a curved configuration that deviates from a shape of the cover substrate 302 when the cover substrate 302 is in a mechanically neutral state free from external forces being applied thereto. In embodiments, the support structure 318 is also configured to be attached directly to a component of a vehicle interior system (such as the vehicle interior system 10 described herein with respect to FIG. 1), such that the support structure 318 aids in positioning the display assembly 300 at a desired location within a vehicle.

In embodiments, the support structure 318 includes a plurality of components that are movable relative to one another so as to dynamically bend the cover substrate 302 and position display components attached thereto in a desired viewing configuration. In such embodiments, the dynamic bending of the cover substrate 302 may be localized to particular portions of the cover substrate 302. That is, certain portions of the cover substrate 302 may not bend or change in shape as the display assembly 300 is moved between configurations. Display electronics may be adhered (or attached via other suitable method) to the second major surface 306 in the portions of the cover substrate 102 that do not change in shape during the bending. Such placement of the display electronics beneficially avoids changes in optical performance of the displays when the display assembly 300 is switched between the different configurations described herein.

In embodiments, the particular portions of the cover substrate 302 that are bent when the display assembly 300 is changed between the different configurations described herein are determined by the components of the support structure 318. In the depicted embodiment, for example, the support structure 318 is depicted to include a first frame portion 320 that is adhered to the second major surface 306 of a first portion 322 of the cover substrate 302 and a second frame portion 324 that is adhered to the second major surface 306 of a second portion 326 of the cover substrate 302. The first and second frame portions 320 and 324 of the support structure 318 may define first and second apertures (not depicted in FIG. 3A) via which suitable display electronics may be visible through the cover substrate 302. For example, in embodiments, first and second display panels are adhered to the second major surface 306 via optically clear adhesives within the first and second apertures defined by the first and second frame portions 320 and 234. The first and second apertures may have any suitable size or shape for accommodating desired display components (e.g., display panels having a desired shape or size).

In embodiments, the first and second frame portions 320 and 324 are constructed of a suitable material (e.g., a suitable metallic material or alloy such as aluminum or stainless steel, a suitable polymeric material, a suitable composite material) such that the first and second frame portions 320 and 324 are more structurally rigid than the first and second portions 322 and 326 of the cover substrate 302. As a result, the first and second frame portions 320 and 324 may retain the first and second portions 322 and 326 in suitable first and second fixed shapes, irrespective of the bending configuration of the display assembly 300. Such operation beneficially aids in reducing shear stresses on adhesive used to attach the first and second frame portions 320 and 324 to the second major surface 306, as described herein. Moreover, detrimental optical effects caused by the first and second portions 322 and 326—which may lie directly adjacent to the display electronics—may be avoided by the additional structural support provided by the first and second frame portions 320 and 324.

In embodiments, one or both of the first portion 322 and the second portion 326 of the cover substrate 302 may be flat or substantially flat (e.g., having a radius of curvature greater than 10,000 mm, greater than 15,000 mm or greater than 20,000 mm). In embodiments, one or both of the first portion 322 and the second portion 326 of the cover substrate 302 may be curved (e.g., having a radius of curvature less than or equal to 10,000 mm, less than or equal to 15,000 mm or less than or equal to 20,000 mm). In embodiments, one or both of the first portion 322 and the second portion 326 of the cover substrate 302 may be cold-formed and curved, hot-formed and curved or cold-formed and hot-formed and curved.

In embodiments, the cover substrate 102 includes a dynamic bending portion 328 extending between the first portion 322 and the second portion 326. The dynamic bending portion 328 may not be directly attached to the relatively rigid first and second frame portions 320 and 324 and, as a result, may bend as the relative positioning of the first and second frame portions 320 and 324 changes via operation of the display assembly 300 as described herein. For example, an external force may be applied to at least one of the first frame portion 320 and the second frame portion 324 to move the second frame portion 324 relative to the first frame portion 320. The external force may be sufficiently large to bend the cover substrate 302 within the dynamic bending portion 328, but may not alter the shape of the first frame portion 320 and the second frame portion 324. By selectively providing a desired distribution of structural rigidity to the cover substrate 302, the support structure 318 determines the manner with which the covers substrate 302 changes in shape response to application of external forces thereto.

In embodiments, the dimensions of the dynamic bending portion 328 are determined at least in part based on the extent of the area of the first and second frame portions 320 and 324 that are adhered directly to the second major surface 306. As depicted in FIG. 3A, for example, the first and second frame portions 320 and 324 include transverse edges 330 and 332 that overlap the transverse edges 316 of the cover substrate 302. A longitudinal edge 334 of the first frame portion 320 may be adhered to the second major surface 306 via an adhesive layer (not depicted in FIG. 3A) extending from the transverse edge 332 and a first edge 338 of the dynamic bending portion 328. A longitudinal edge 336 of the second frame portion 324 may be adhered to the second major surface 306 via an adhesive layer extending from the transverse edge 330 to a second edge of the dynamic bending portion. The lateral extent of the adhesive layer applied between the first and second frame portions 320 and 324 and the second major surface 306 of the cover substrate 302 may correspond to the dimensions of the longitudinal edges 334 and 336. In embodiments, the first and second frame portions 320 and 324 are sized such that the dynamic bending portion 328 has a dimension $L_b$ along the second axis 310 that is less than or equal to L (e.g. less than or equal to 0.5*L, less than or equal to 0.25*L). In embodiments, $L_b$ is greater than or equal to 3 mm and less than or equal to 300 mm (e.g., greater than or equal to 10 mm and less than or equal to 250 mm, greater than or equal to 20 mm and less than or equal to 200 mm, greater than or equal to 30 mm and less than or equal to 150 mm, greater than or equal to 40 mm and less than or equal to 100 mm).

Figure 3B:
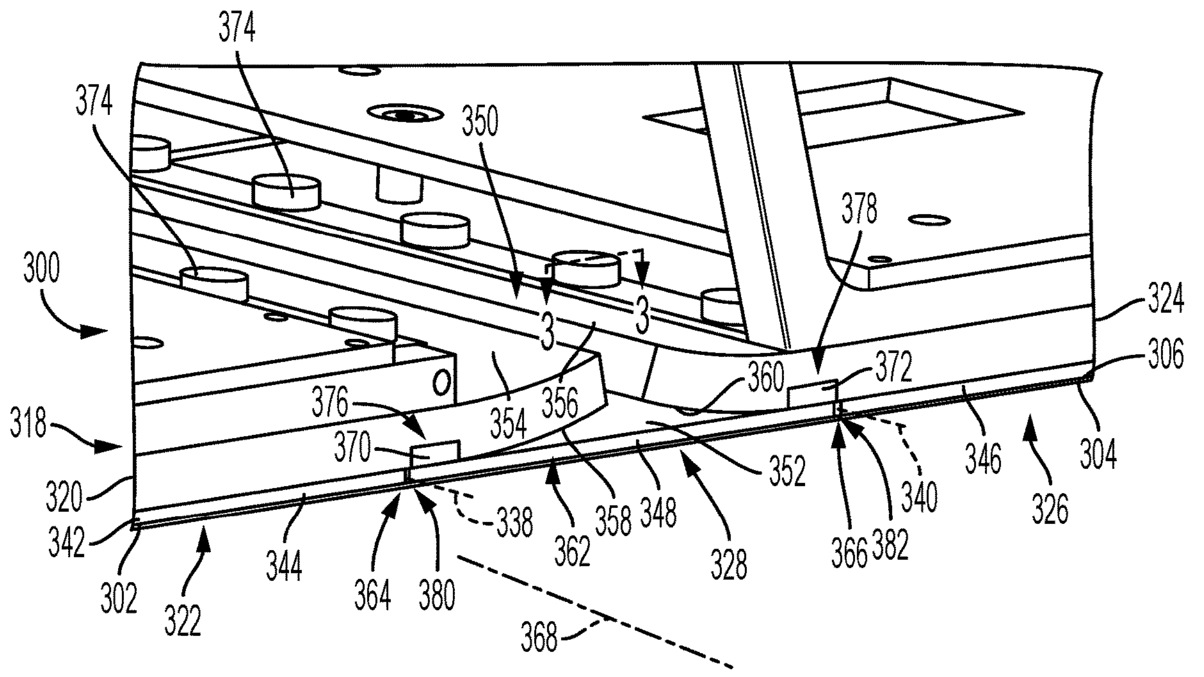
FIG. 3B depicts another perspective view of the dynamically bendable automotive interior display depicted in FIG. 3A, according to one or more embodiments of the present disclosure.

FIG. 3B depicts another view of a portion of the display assembly 300 depicted in FIG. 3A, according to an example embodiment of the present disclosure. As shown in FIG. 3B, an adhesive layer 342 is disposed between and bonded to the second major surface 306 of the cover substrate 302 and various components of the support structure 318. As shown, the adhesive layer 342 includes a first adhesive layer portion 344 attaching the first frame portion 320 to the first portion 322 of the cover substrate 302, a second adhesive layer portion 346 attaching the second frame portion 324 to the second portion 326 of the cover substrate 302, and a third adhesive layer portion 348 attaching the dynamic bending portion 328 of the cover substrate 302 to a central portion 350 of the support structure 318.

In embodiments, the central portion 350 of the support structure 318 provides structural support to the dynamic bending portion 328 to facilitate the dynamic bending portion 328 having sufficient strength to not break or fracture during headform impact testing. The central portion 350 may provide structural support to the dynamic bending portion 328 in the event the dynamic bending portion 328 undergoes an impact from the first major surface 304 of the cover substrate 302, but may have a flexural rigidity that is less than the first and second frame portions 320 and 324 to permit the dynamic bending portion 328 to bend via application of relatively low bending forces thereto. Various embodiments of the central portion 350 of the support structure 318 will be described in greater detail herein.

In the embodiment depicted in FIG. 3B, the central portion 350 of the support structure 318 includes a flexible support layer 352 attached to the second major surface 306 via the third adhesive layer portion 348 as well as support mandrels 354 and 356 extending from the first and second frame portions 320 and 324. The support mandrels 354 and 356 include curved support surfaces 358 and 360 that curve away from the flexible support layer 352 with increasing distance from the first and second edges 338 and 340 of the dynamic bending portion 328, such that a gap 362 extends between the flexible support layer 352 and the curved support surfaces 358 and 360. The gap 362 permits the dynamic bending portion 328 to retain the flexibility to bend to change the configuration of the display assembly 300 as described herein, while still providing structural support to the dynamic bending portion 328 in the event of an external impact. The support structure 318 is designed to provide flexibility in configuring the display assembly 300 while still meeting certain regulatory requirements for vehicle interior display systems. The support structure 318 structurally supports the first and second display electronics 106A and 106B (see FIG. 1), while the flexible support layer 352 is a flexible backer that has a fatigue strength that exceeds the material stresses induced by bending the system to the designed shape.

Referring still to FIG. 3B, the support structure 318 includes a first shear joint 364 disposed proximate to the first edge 338 of the dynamic bending portion 328 and a second shear joint 366 disposed proximate to the second edge 340 of the dynamic bending portion 328. The first shear joint 364 connects the first frame portion 320 to a first edge the central portion 350 of the support structure 318, while permitting relative movement between the first frame portion 320 and the central portion 350 in at least one direction (e.g., along the second axis 310 and or the third axis 312 depicted in FIG. 3A). The second shear joint 366 connects the second frame portion 324 to a second edge of the central portion 350 of the support structure 318, while permitting relative movement between the second frame portion 324 and the central portion 350 in at least one direction. In embodiments, the first and second shear joints 364 and 366 permit the central portion 350 to move along the second axis 310 (see FIG. 3A) relative to the first and second frame portions 320 and 324 as the dynamic bending portion 328 is bent about a bending axis 368. The degree of freedom along the first axis 310, which extends perpendicular to the bending axis 368 and along a lengthwise dimension of the display assembly 300, beneficially prevents bending stresses present in the central portion 350 (e.g., within the flexible support layer 352) from being transferred to the first and second frame portions 320 and 324 and prevents the first and second frame portions 320 and 324 from deforming as a result of such bending stresses. It has been found that the presence of the shear joints 364 and 366 beneficially lowers overall stresses within the first adhesive layer portion 344 and the second adhesive layer portion 346, reducing the risk of delamination and component failure.

A variety of structures for the first and second shear joints 364 and 366 are contemplated and within the scope of the present disclosure. In the embodiment depicted in FIGS. 3A and 3B, for example, the first shear joint 364 includes a first connection structure 370 bonded to the flexible support layer 352 (e.g., via adhesive, welding, or other suitable bonding technique) of the central portion 350. The second shear joint 366 includes a second connection structure 372 bonded to the flexible support layer 352. The first and second connection structures 370 and 372 may have any suitable shape. In the depicted embodiment, the first and second connection structures 370 and 372 are connection blocks (or strips) extending an entirety of the dimension of the transverse edges 330 and 332 (see FIG. 3A) of the first and second frame portions 320 and 324 across the second major surface 306. The first and second connection structures 370 and 372 are secured to the first and second frame portions 320 and 324, respectively, via connection elements 374 extending through openings (not depicted in FIG. 3B) in the first and second frame portions 320 and 324. The connection elements 374 may be suitable fasteners that secure the first and second frame portions 320 and 324 to the first and second connection structures 370 and 372.

In embodiments the first frame portion 320 forms a first cavity 376 in conjunction with the first support mandrel 354 and the second frame portion 324 forms a second cavity 378 in conjunction with the second support mandrel 360. The first connection structure 370 is disposed in the first cavity 376 and the second connection structure 372 is disposed in the second cavity 378. In embodiments, the first and second cavities 376 and 378 have dimensions along the second axis 310 (see FIG. 3A) that are greater than those of the first and second connection structures 370 and 372. The openings in the first and second frame portions 320 and 324 through which the connection elements 374 extend may also have a greater dimension along the second axis 310 than the connection elements 374. As a result, the flexible support layer 352 may contract upon being bent from application of an external force thereto, resulting in the first and second connection structures 370 and 372 moving inward towards the geometric center of the display assembly 300. The degree of freedom provided by the first and second shear joints 364 and 366 prevents the bending-induced shear stresses from extending outward from the first and second edges 338 and 340 and causing shear stresses in the first adhesive layer portion 344 and the second adhesive layer portion 346. As a result of the first and second shear joints 364 and 366, the first and second adhesive layer portions 344 and 346 may be free from bending-induced shear stresses. As a result, the first and second shear joints 364 and 366 may aid in lowering the amounts of shear stress in the adhesive layer 342, thereby lowering the probability of component failure.

Referring still to FIG. 3B, the adhesive layer 342 is depicted to include a first gap 380 disposed between the first adhesive layer portion 344 and the third adhesive layer portion 348 and a second gap 382 disposed between the second adhesive layer portion 346 and the third adhesive layer portion 348. The first and second gaps 380 and 382 may define the first and second edges 338 and 340 of the dynamic bending portion 328 of the cover substrate 302. In embodiments, the first and second gaps 380 and 382 are areas devoid of the adhesive of the adhesive layer 342 and may be of any suitable size. In embodiments, the first and second gaps 380 are boundaries of between adhesive layer portions that are in contact with one another (e.g., slices in an adhesive layer). The first and second gaps 380 and 382 may also prevent bending-induced shearing stresses that are present in the third adhesive layer portion 348 from reaching the first adhesive layer portion 344 and the second adhesive layer portion 346. The first and second gaps 380 and 382 may also decouple strain distributions in each of the first, second, and third adhesive layer portions, 344, 346, and 348. As a result, the L variable in Equations 1 and 2 is separately applied to each of the first, second, and third adhesive layer portions, 344, 346, and 348, which lowers the maximum amount of thermally-induced shear stress that the adhesive layer 342 is exposed to.

Figure 3C:
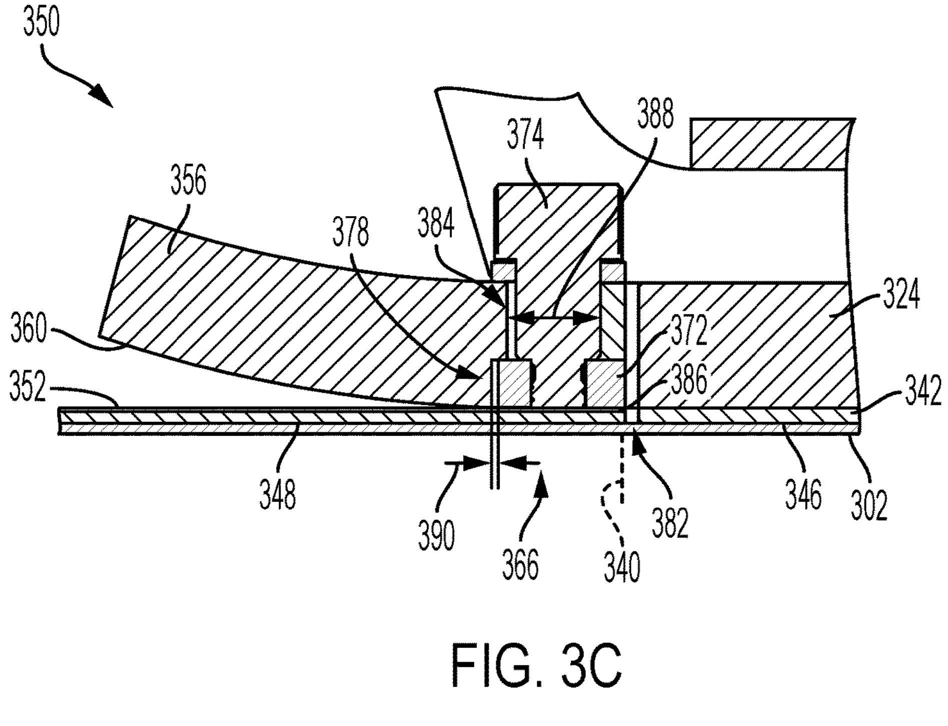
FIG. 3C schematically depicts a cross-sectional view of a shear joint of the dynamically bendable automotive interior display depicted in FIG. 3A, according to one or more embodiments of the present disclosure.

FIG. 3C depicts a cross sectional view of a portion of the display assembly 300 through the line 3-3 depicted in FIG. 3B, according to an example embodiment. As shown in FIG. 3C, the flexible support layer 352 is depicted to include a thickness that is less than that of the adhesive in the third adhesive layer portion 348. The thickness of the flexible support layer 352 is also less than that of the cover substrate 302 in the depicted embodiment. In embodiments, the flexible support layer 352 is co-extensive with the dynamic bending portion 328 and extends from the first edge 338 (see FIG. 3B) to the second edge 340. The flexible support layer 352 may be constructed of a material having a higher flexural strength than that of the cover substrate 302. In embodiments, the flexible support layer 352 is constructed of stainless steel (e.g., Type 301 stainless steel) or other suitable material of relatively high tensile strength (e.g., greater than or equal to 1000 MPa). When so constructed, the flexible support layer 352 stiffens the dynamic bending portion 328 and may absorb impact energy to prevent breakage of the cover substrate 302 during external impact events. The flexible support layer 352 is constructed depending on the bending stresses in operations. In embodiments, the thickness of the flexible support layer 352 is greater than or equal to 0.1 mm and less than or equal to 1.0 mm (e.g., greater than or equal to 0.2 mm and less than or equal to 0.9 mm, greater than or equal to 0.3 mm and less than or equal to 0.8 mm, greater than or equal to 0.4 mm and less than or equal to 0.7 mm).

In embodiments, the second gap 382 in the adhesive layer 342 coincides with an edge 386 of the flexible support layer 352. Although alternative locations for the second gap 382 are envisioned (e.g., the first and second gaps 380 and 382 may be disposed outward of the edge 386), such a structure may maximize the lateral extent of the third adhesive layer portion 348 without transferring any bending-induced shear stresses to portions of the adhesive layer 342 overlapping the first and second portions 322 and 326 of the cover substrate 302, which may aid in reducing the overall shear stress in the adhesive layer 142.

As is further shown in FIG. 3C, the second frame portion 324 includes a opening 384 having a dimension 388 along the second axis 310 (see FIG. 3A) that is greater than that of the connection element 374 extending through the opening 384 into the second connection structure 372 to connect the second frame portion 324 to the central portion 350 and flexible support layer 352. The second cavity 378 also possesses a greater dimension than the second connection structure 372 along the first axis 310, thereby providing a clearance 390 for the flexible support layer 352 to contract when bent about the bending axis 368 (see FIG. 3B) and move relative to the second frame portion 324. Such contraction of the flexible support layer 352 pulls the third adhesive layer portion 348 inward (towards a center of the display assembly 300) proximate to the edge 386. However, the second gap 382 prevents any shear stresses from such contraction from extending into the second adhesive layer portion 346.

With reference to FIGS. 3A-3C, the first and second shear joints 364 and 366 provide longitudinal movement of the central portion 350 relative to the first and second frame portions 320 and 324, while constraining the other degrees of freedom of the portions of the support structure 318 relative to each other. The connection provided by the plurality of connection elements 374 and the connection structures 370 and 372 provides a stiff enough connection to prevent unwanted rotation of the components of the support structure 318 relative to one another. That is, the support structure 318 is able to retain the cover substrate 302 in a desired shape, while decoupling stresses in portions of support structure 318 from one another. The support structure 318 is also stiff enough to withstand bending stresses associated with external impact events without excessive deflection of the components relative to one another. The display assembly 300 thus provides stress relief in the adhesive layer 342 without hindering the ability of the cover substrate 302 to meet regulatory impact testing requirements.

As shown in FIG. 3A, the display assembly 300 further includes an actuator assembly 392 configured to move the first frame portion 320 relative to the second frame portion 324 to change the relative viewing angle of the displays attached thereto. As shown, the actuator assembly 392 includes a drive unit 394 attached to the first frame portion 320 and an attachment bracket 396 attached to the second frame portion 324. The attachment bracket 396 is coupled to a drive arm 397 extending from the drive unit 394. The drive unit 394 may include a suitable actuator or motor to advance the drive arm 397 from the depicted position. The drive arm 397 is connected to the attachment bracket 396 via a rotatable connection (e.g., a hinge, a pivoting connection, any other suitable connection). Advancement of the drive arm 397 from the depicted position may cause the second frame portion 324 to move along a rotation path 399 relative to the first frame portion 320, thereby bending the cover substrate 302 in the dynamic bending portion 328 and changing the relative viewing angles of the two displays that may be incorporated behind the first portion 322 and the second portion 326.

As used herein, "display" includes a visual display with or without touch functionality, a touch panel, or a combination thereof. The display may be flat or curved.

Various attributes of the cover substrate 302 will now be described in greater detail according to example embodiments.

Cover substrate 302 may include an inorganic material and may include an amorphous substrate, a crystalline substrate or a combination thereof. The cover substrate may be formed from man-made materials and/or naturally occurring materials (e.g., quartz and polymers). For example, in some instances, the cover substrate may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the cover substrate 302 may specifically exclude polymeric, plastic and/or metal substrates. In embodiments, the cover substrate 302 may be combined with a polymeric, plastic or metal substrate to form a laminate. In embodiments, the cover substrate 302 exhibits a refractive index in the range from about 1.45 to about 1.55. In specific embodiments, the cover substrate 302 may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the cover substrate 302 may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable cover substrates may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In embodiments, the cover substrate 302 may include an amorphous substrate, which may include a glass substrate. The glass substrate may be strengthened or non-strengthened. Examples of suitable glass composition families used to form the glass articles include soda lime glass, alkali aluminosilicate glass, alkali containing borosilicate glass and alkali aluminoborosilicate glass. In one or more alternative embodiments, the cover substrate 302 may include crystalline substrates such as glass ceramic substrate (which may be strengthened or non-strengthened) or may include a single crystal structure, such as sapphire. In one or more specific embodiments, the cover substrate 302 includes an amorphous base (e.g., glass) and a crystalline cladding (e.g., sapphire layer, a polycrystalline alumina layer and/or or a spinel (MgAl2O4) layer).

The cover substrate 302 may be substantially optically clear, transparent and free from light scattering. In such embodiments, the cover substrate 302 may exhibit an average light transmission over the optical wavelength regime (e.g., in the visible spectrum) of about 85% or greater, about 86% or greater, about 87% or greater, about 88% or greater, about 89% or greater, about 90% or greater, about 91% or greater or about 92% or greater. In one or more alternative embodiments, the cover substrate may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In some embodiments, these light transmittance values are total transmittance values (taking into account transmittance through both major surfaces of the substrate). The cover substrate 302 may optionally exhibit a color, such as white, black, red, blue, green, yellow, orange etc.

In embodiments, the cover substrate 302 has a thickness (T, see FIG. 3A) that is about 2 mm or less or about 1.5 mm or less. In embodiments, the thickness T of the cover substrate is substantially uniform in that the thickness is substantially the same in the first portion 322, second portion 326, and dynamic bending portion 328. For example, in embodiments, the thickness T of the cover substrate 302 does not vary by more than ±10%, 5% or 2% across the total surface area of the first major surface 304, the second major surface 306 or both the first and second major surfaces 304 and 306. In embodiments, the thickness T is substantially constant (within ±1% of the average thickness) across 90%, 95% or 99% of the total surface area of the first major surface 304, the second major surface 306 or both the first and second major surfaces 304 and 306.

In embodiments, the cover substrate 302 may be a glass substrate that is strengthened and exhibits a compressive stress (CS) region that extends from one or both major surfaces to a first depth of compression (DOC) measured from the major surface. The CS region includes a maximum CS magnitude ($CS_{max}$). In such embodiments, the cover substrate 302 has a CT region disposed in the central region that extends from the DOC to an opposing CS region. The CT region defines a maximum CT magnitude ($CT_{max}$). The CS region and the CT region define a stress profile that extends along the thickness of the cover glass substrate.

In embodiments, the cover substrate 302, when constructed of glass, may be strengthened mechanically by utilizing a mismatch of the coefficient of thermal expansion between portions of the substrate to create a compressive stress region and a central region exhibiting a tensile stress. In some embodiments, cover substrate 302, when constructed of glass, may be strengthened thermally by heating the glass to a temperature above the glass transition point and then rapidly quenching.

In embodiments, the cover substrate 302 may be chemically strengthening by ion exchange. In the ion exchange process, ions at or near the surface of the cover glass substrate are replaced by—or exchanged with—larger ions having the same valence or oxidation state. In those embodiments in which the cover glass substrate includes an alkali-containing glass, ions in the surface layer of the article and the larger ions are monovalent alkali metal cations, such as Lit, Na+, K+, Rb+, and Cs+. Alternatively, monovalent cations in the surface layer may be replaced with monovalent cations other than alkali metal cations, such as Ag+ or the like. In such embodiments, the monovalent ions (or cations) exchanged into the cover glass substrate generate a stress.

In embodiments, the cover substrate 302 has a $CS_{max}$ that is about 900 MPa or greater, about 920 MPa or greater, about 940 MPa or greater, about 950 MPa or greater, about 960 MPa or greater, about 980 MPa or greater, about 1000 MPa or greater, about 1020 MPa or greater, about 1040 MPa or greater, about 1050 MPa or greater, about 1060 MPa or greater, about 1080 MPa or greater, about 1100 MPa or greater, about 1120 MPa or greater, about 1140 MPa or greater, about 1150 MPa or greater, about 1160 MPa or greater, about 1180 MPa or greater, about 1200 MPa or greater, about 1220 MPa or greater, about 1240 MPa or greater, about 1250 MPa or greater, about 1260 MPa or greater, about 1280 MPa or greater, or about 1300 MPa or greater. In embodiments, the $CS_{max}$ is in a range from about 900 MPa to about 1500 MPa, from about 920 MPa to about 1500 MPa, from about 940 MPa to about 1500 MPa, from about 950 MPa to about 1500 MPa, from about 960 MPa to about 1500 MPa, from about 980 MPa to about 1500 MPa, from about 1000 MPa to about 1500 MPa, from about 1020 MPa to about 1500 MPa, from about 1040 MPa to about 1500 MPa, from about 1050 MPa to about 1500 MPa, from about 1060 MPa to about 1500 MPa, from about 1080 MPa to about 1500 MPa, from about 1100 MPa to about 1500 MPa, from about 1120 MPa to about 1500 MPa, from about 1140 MPa to about 1500 MPa, from about 1150 MPa to about 1500 MPa, from about 1160 MPa to about 1500 MPa, from about 1180 MPa to about 1500 MPa, from about 1200 MPa to about 1500 MPa, from about 1220 MPa to about 1500 MPa, from about 1240 MPa to about 1500 MPa, from about 1250 MPa to about 1500 MPa, from about 1260 MPa to about 1500 MPa, from about 1280 MPa to about 1500 MPa, from about 1300 MPa to about 1500 MPa, from about 900 MPa to about 1480 MPa, from about 900 MPa to about 1460 MPa, from about 900 MPa to about 1450 MPa, from about 900 MPa to about 1440 MPa, from about 900 MPa to about 1420 MPa, from about 900 MPa to about 1400 MPa, from about 900 MPa to about 1380 MPa, from about 900 MPa to about 1360 MPa, from about 900 MPa to about 1350 MPa, from about 900 MPa to about 1340 MPa, from about 900 MPa to about 1320 MPa, from about 900 MPa to about 1300 MPa, from about 900 MPa to about 1280 MPa, from about 900 MPa to about 1260 MPa, from about 900 MPa to about 1250 MPa, from about 900 MPa to about 1240 MPa, from about 900 MPa to about 1220 MPa, from about 900 MPa to about 1210 MPa, from about 900 MPa to about 1200 MPa, from about 900 MPa to about 1180 MPa, from about 900 MPa to about 1160 MPa, from about 900 MPa to about 1150 MPa, from about 900 MPa to about 1140 MPa, from about 900 MPa to about 1120 MPa, from about 900 MPa to about 1100 MPa, from about 900 MPa to about 1080 MPa, from about 900 MPa to about 1060 MPa, from about 900 MPa to about 1050 MPa, or from about 950 MPa to about 1050 MPa, or from about 1000 MPa to about 1050 MPa. $CS_{max}$ may be measured at one of the first and second major surfaces 304 and 306 or may be found at a depth from the major surface within the CS region.

In embodiments, the cover substrate 302 has stress profile including a CS magnitude of 800 MPa or greater at a depth within the cover substrate of about 10 micrometers from one or both of first major surface 304 and the second major surface 306 (CS10). In embodiments, the CS10 is about 810 MPa or greater, about 820 MPa or greater, about 830 MPa or greater, about 840 MPa or greater, about 850 MPa or greater, about 860 MPa or greater, about 870 MPa or greater, about 880 MPa or greater, about 890 MPa or greater, or about 900 MPa or greater. In embodiments, the CS10 is in a range from about 800 MPa to about 1000 MPa, from about 825 MPa to about 1000 MPa, from about 850 MPa to about 1000 MPa, from about 875 MPa to about 1000 MPa, from about 900 MPa to about 1000 MPa, from about 925 MPa to about 1000 MPa, from about 950 MPa to about 1000 MPa, from about 800 MPa to about 975 MPa, from about 800 MPa to about 950 MPa, from about 800 MPa to about 925 MPa, from about 800 MPa to about 900 MPa, from about 800 MPa to about 875 MPa, or from about 800 MPa to about 850 MPa.

In embodiments, the cover substrate 302 has a stress profile with a CS magnitude of 700 MPa or greater, or about 750 MPa or greater at a depth within the cover substrate 302 of about 5 micrometers from one or both of first major surface 304 and the second major surface 306 (CS5). In embodiments, the CS5 is about 760 MPa or greater, about 770 MPa or greater, about 775 MPa or greater, about 780 MPa or greater, about 790 MPa or greater, about 800 MPa or greater, about 810 MPa or greater, about 820 MPa or greater, about 825 MPa or greater, or about 830 MPa or greater. In embodiments, the CS5 is in a range from about 700 MPa to about 900 MPa, from about 725 MPa to about 900 MPa, from about 750 MPa to about 900 MPa, from about 775 MPa to about 900 MPa, from about 800 MPa to about 900 MPa, from about 825 MPa to about 900 MPa, from about 850 MPa to about 900 MPa, from about 700 MPa to about 875 MPa, from about 700 MPa to about 850 MPa, from about 700 MPa to about 825 MPa, from about 700 MPa to about 800 MPa, from about 700 MPa to about 775 MPa, from about 750 to about 800 MPa, from about 750 MPa to about 850 MPa, or from about 700 MPa to about 750 MPa.

In embodiments, the $CT_{max}$ magnitude is about 80 MPa or less, about 78 MPa or less, about 76 MPa or less, about 75 MPa or less, about 74 MPa or less, about 72 MPa or less, about 70 MPa or less, about 68 MPa or less, about 66 MPa or less, about 65 MPa or less, about 64 MPa or less, about 62 MPa or less, about 60 MPa or less, about 58 MPa or less, about 56 MPa or less, about 55 MPa or less, about 54 MPa or less, about 52 MPa or less, or about 50 MPa or less. In embodiments, the $CT_{max}$ magnitude is in a range from about 40 MPa to about 80 MPa, from about 45 MPa to about 80 MPa, from about 50 MPa to about 80 MPa, from about 55 MPa to about 80 MPa, from about 60 MPa to about 80 MPa, from about 65 MPa to about 80 MPa, from about 70 MPa to about 80 MPa, from about 40 MPa to about 75 MPa, from about 40 MPa to about 70 MPa, from about 40 MPa to about 65 MPa, from about 40 MPa to about 60 MPa, from about 40 MPa to about 55 MPa, or from about 40 MPa to about 50 MPa.

In embodiments, the DOC of the cover glass substrate is about 0.2*thickness of the glass substrate (0.2*T) or less. For example, DOC may be about 0.18 T or less, about 0.18 T or less, about 0.16 T or less, about 0.15 T or less, about 0.14 T or less, about 0.12 T or less, about 0.1 T or less, about 0.08 T or less, about 0.06 T or less, about 0.05 T or less, about 0.04 T or less, or about 0.03 T or less. In embodiments, DOC is in a range from about 0.02 T to about 0.2 T, from about 0.04 T to about 0.2 T, from about 0.05 T to about 0.2 T, from about 0.06 T to about 0.2 T, from about 0.08 T to about 0.2 T, from about 0.1 T to about 0.2 T, from about 0.12 T to about 0.2 T, from about 0.14 T to about 0.2 T, from about 0.15 T to about 0.2 T, from about 0.16 T to about 0.2 T, from about 0.02 T to about 0.18 T, from about 0.02 T to about 0.16 T, from about 0.02 T to about 0.15 T, from about 0.02 T to about 0.14 T, from about 0.02 T to about 0.12 T, from about 0.02 T to about 0.1 Tt, from about 0.02 T to about 0.08 T, from about 0.02 T to about 0.06 T, from about 0.02 T to about 0.05 T, from about 0.1 T to about 0.8 T, from about 0.12 T to about 0.16 T, or from about 0.14 T to about 0.17 T.

In embodiments, the cover glass substrate may be unstrengthened. In some embodiments, the unstrengthened glass includes an annealed glass.

Exemplary compositions for such glass substrate may include a soda-lime silicate glass composition, an alumino-silicate glass composition, or an alkali aluminosilicate glass composition.

In embodiments, the thickness (T) is in a range from about 0.1 mm to about 6 mm or that is in a range from about 0.1 mm to about 1.5 mm. For example, T may be greater than about 0.125 mm (e.g., about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater). In embodiments, T may be in a range from about 0.01 mm to about 1.5 mm, 0.02 mm to about 1.5 mm, 0.03 mm to about 1.5 mm, 0.04 mm to about 1.5 mm, 0.05 mm to about 1.5 mm, 0.06 mm to about 1.5 mm, 0.07 mm to about 1.5 mm, 0.08 mm to about 1.5 mm, 0.09 mm to about 1.5 mm, 0.1 mm to about 1.5 mm, from about 0.15 mm to about 1.5 mm, from about 0.2 mm to about 1.5 mm, from about 0.25 mm to about 1.5 mm, from about 0.3 mm to about 1.5 mm, from about 0.35 mm to about 1.5 mm, from about 0.4 mm to about 1.5 mm, from about 0.45 mm to about 1.5 mm, from about 0.5 mm to about 1.5 mm, from about 0.55 mm to about 1.5 mm, from about 0.6 mm to about 1.5 mm, from about 0.65 mm to about 1.5 mm, from about 0.7 mm to about 1.5 mm, from about 0.01 mm to about 1.4 mm, from about 0.01 mm to about 1.3 mm, from about 0.01 mm to about 1.2 mm, from about 0.01 mm to about 1.1 mm, from about 0.01 mm to about 1.05 mm, from about 0.01 mm to about 1 mm, from about 0.01 mm to about 0.95 mm, from about 0.01 mm to about 0.9 mm, from about 0.01 mm to about 0.85 mm, from about 0.01 mm to about 0.8 mm, from about 0.01 mm to about 0.75 mm, from about 0.01 mm to about 0.7 mm, from about 0.01 mm to about 0.65 mm, from about 0.01 mm to about 0.6 mm, from about 0.01 mm to about 0.55 mm, from about 0.01 mm to about 0.5 mm, from about 0.01 mm to about 0.4 mm, from about 0.01 mm to about 0.3 mm, from about 0.01 mm to about 0.2 mm, from about 0.01 mm to about 0.1 mm, from about 0.04 mm to about 0.07 mm, from about 0.1 mm to about 1.4 mm, from about 0.1 mm to about 1.3 mm, from about 0.1 mm to about 1.2 mm, from about 0.1 mm to about 1.1 mm, from about 0.1 mm to about 1.05 mm, from about 0.1 mm to about 1 mm, from about 0.1 mm to about 0.95 mm, from about 0.1 mm to about 0.9 mm, from about 0.1 mm to about 0.85 mm, from about 0.1 mm to about 0.8 mm, from about 0.1 mm to about 0.75 mm, from about 0.1 mm to about 0.7 mm, from about 0.1 mm to about 0.65 mm, from about 0.1 mm to about 0.6 mm, from about 0.1 mm to about 0.55 mm, from about 0.1 mm to about 0.5 mm, from about 0.1 mm to about 0.4 mm, or from about 0.3 mm to about 0.7 mm.

In embodiments, the width W is in a range from about 5 cm to about 250 cm, from about 10 cm to about 250 cm, from about 15 cm to about 250 cm, from about 20 cm to about 250 cm, from about 25 cm to about 250 cm, from about 30 cm to about 250 cm, from about 35 cm to about 250 cm, from about 40 cm to about 250 cm, from about 45 cm to about 250 cm, from about 50 cm to about 250 cm, from about 55 cm to about 250 cm, from about 60 cm to about 250 cm, from about 65 cm to about 250 cm, from about 70 cm to about 250 cm, from about 75 cm to about 250 cm, from about 80 cm to about 250 cm, from about 85 cm to about 250 cm, from about 90 cm to about 250 cm, from about 95 cm to about 250 cm, from about 100 cm to about 250 cm, from about 110 cm to about 250 cm, from about 120 cm to about 250 cm, from about 130 cm to about 250 cm, from about 140 cm to about 250 cm, from about 150 cm to about 250 cm, from about 5 cm to about 240 cm, from about 5 cm to about 230 cm, from about 5 cm to about 220 cm, from about 5 cm to about 210 cm, from about 5 cm to about 200 cm, from about 5 cm to about 190 cm, from about 5 cm to about 180 cm, from about 5 cm to about 170 cm, from about 5 cm to about 160 cm, from about 5 cm to about 150 cm, from about 5 cm to about 140 cm, from about 5 cm to about 130 cm, from about 5 cm to about 120 cm, from about 5 cm to about 110 cm, from about 5 cm to about 110 cm, from about 5 cm to about 100 cm, from about 5 cm to about 90 cm, from about 5 cm to about 80 cm, or from about 5 cm to about 75 cm.

In embodiments, the length L in a range from about 5 cm to about 250 cm, from about 10 cm to about 250 cm, from about 15 cm to about 250 cm, from about 20 cm to about 250 cm, from about 25 cm to about 250 cm, from about 30 cm to about 250 cm, from about 35 cm to about 250 cm, from about 40 cm to about 250 cm, from about 45 cm to about 250 cm, from about 50 cm to about 250 cm, from about 55 cm to about 250 cm, from about 60 cm to about 250 cm, from about 65 cm to about 250 cm, from about 70 cm to about 250 cm, from about 75 cm to about 250 cm, from about 80 cm to about 250 cm, from about 85 cm to about 250 cm, from about 90 cm to about 250 cm, from about 95 cm to about 250 cm, from about 100 cm to about 250 cm, from about 110 cm to about 250 cm, from about 120 cm to about 250 cm, from about 130 cm to about 250 cm, from about 140 cm to about 250 cm, from about 150 cm to about 250 cm, from about 5 cm to about 240 cm, from about 5 cm to about 230 cm, from about 5 cm to about 220 cm, from about 5 cm to about 210 cm, from about 5 cm to about 200 cm, from about 5 cm to about 190 cm, from about 5 cm to about 180 cm, from about 5 cm to about 170 cm, from about 5 cm to about 160 cm, from about 5 cm to about 150 cm, from about 5 cm to about 140 cm, from about 5 cm to about 130 cm, from about 5 cm to about 120 cm, from about 5 cm to about 110 cm, from about 5 cm to about 110 cm, from about 5 cm to about 100 cm, from about 5 cm to about 90 cm, from about 5 cm to about 80 cm, or from about 5 cm to about 75 cm.

In some embodiments, the cover substrate 302 may be or include a relatively thin steel laminate or other thin laminate product. The cover substrate 302 may additionally or alternatively be coated, decorated, or otherwise pre-treated. In embodiments, the either one of or both of the first major surface 304 and the second major surface 306 of the cover substrate 302 includes a surface treatment. The surface treatment may cover at least a portion of one or both major surfaces. Exemplary surface treatments include an easy-to-clean surface, an anti-glare surface, an anti-reflective surface, a haptic surface, and a decorative surface. In embodiments, at least a portion of either one of or both of the first major surface 304 and the second major surface 306 may include any one, any two or all three of an anti-glare surface, an anti-reflective surface, a haptic surface, and a decorative surface. For example, one major surface may include an anti-glare surface and the other opposing major surface may include an anti-reflective surface. In another example, one major surface includes either one of or both the anti-glare surface and the anti-reflective surface, and the other major surface includes the decorative surface.

In embodiments, the anti-glare surface may be formed on the first major surface 304 and/or the second major surface 306 using an etching process and may exhibit a transmission haze 20% or less (e.g., about 15% or less, or about 10% or less), and a distinctiveness of image (DOI) of about 80 or less. As used herein, the terms "transmission haze" and "haze" refer to the percentage of transmitted light scattered outside an angular cone of about ±2.5° in accordance with ASTM procedure D1003. For an optically smooth surface, transmission haze is generally near zero. As used herein, the term "distinctness of image" is defined by method A of ASTM procedure D5767 (ASTM 5767), entitled "Standard Test Methods for Instrumental Measurements of Distinctness-of-Image Gloss of Coating Surfaces," the contents of which are incorporated herein by reference in their entirety. In accordance with method A of ASTM 5767, substrate reflectance factor measurements are made on the anti-glare surface at the specular viewing angle and at an angle slightly off the specular viewing angle. The values obtained from these measurements are combined to provide a DOI value. In particular, DOI is calculated according to the equation $$DOI = \left[1 - \frac{Ros}{Rs}\right] \times 100, \quad \text{(Equation 5)}$$

where Ros is the relative reflection intensity average between 0.2° and 0.4 away from the specular reflection direction, and Rs is the relative reflection intensity average in the specular direction (between +0.05° and −0.05°, centered around the specular reflection direction). If the input light source angle is +20° from the sample surface normal (as it is throughout this disclosure), and the surface normal to the sample is taken as 0°, then the measurement of specular reflected light Rs is taken as an average in the range of about −19.95° to −20.05°, and Ros is taken as the average reflected intensity in the range of about −20.2° to −20.4° (or from −19.6° to −19.8°, or an average of both of these two ranges). As used herein, DOI values should be directly interpreted as specifying a target ratio of Ros/Rs as defined herein. In some embodiments, the anti-glare surface has a reflected scattering profile such that >95% of the reflected optical power is contained within a cone of +/−10°, where the cone is centered around the specular reflection direction for any input angle.

In embodiments, the resulting the anti-glare surface on the first major surface 304 and/or the second major surface 306 may include a textured surface with plurality of concave features having an opening facing outwardly from the surface. The opening may have an average cross-sectional dimension of about 30 micrometers or less. In embodiments, the anti-glare surface exhibits low sparkle (in terms of low pixel power deviation reference or PPDr) such as PPDr of about 6% or less. As used herein, the terms "pixel power deviation referenced" and "PPDr" refer to the quantitative measurement for display sparkle. Unless otherwise specified, PPDr is measured using a display arrangement that includes an edge-lit liquid crystal display screen (twisted nematic liquid crystal display) having a native sub-pixel pitch of 60 μm×180 μm and a sub-pixel opening window size of about 44 μm×about 142 μm. The front surface of the liquid crystal display screen had a glossy, anti-reflection type linear polarizer film. To determine PPDr of a display system or an anti-glare surface that forms a portion of a display system, a screen is placed in the focal region of an "eye-simulator" camera, which approximates the parameters of the eye of a human observer. As such, the camera system includes an aperture (or "pupil aperture") that is inserted into the optical path to adjust the collection angle of light, and thus approximate the aperture of the pupil of the human eye. In the PPDr measurements described herein, the iris diaphragm subtends an angle of 18 milliradians.

In embodiments, the first major surface 304 and/or the second major surface 308 includes an anti-reflective surface. The anti-reflective surface may be formed by a multi-layer coating stack formed from alternating layers of a high refractive index material and a low refractive index material. Such coatings stacks may include 6 layers or more. In embodiments, the anti-reflective surface may exhibit a single-side average light reflectance of about 2% or less (e.g., about 1.5% or less, about 1% or less, about 0.75% or less, about 0.5% or less, or about 0.25% or less) over the optical wavelength regime in the range from about 400 nm to about 800 nm. The average reflectance is measured at an incident illumination angle greater than about 0 degrees to less than about 10 degrees.

In embodiments, the first major surface 304 and/or the second major surface 306 includes a decorative surface. The decorative surface may include any aesthetic design formed from a pigment (e.g., ink, paint and the like) and can include a wood-grain design, a brushed metal design, a graphic design, a portrait, or a logo. In embodiments, the decorative surface exhibits a deadfront effect in which the decorative surface disguises or masks the underlying display from a viewer when the display is turned off but permits the display to be viewed when the display is turned on. The decorative surface may be printed onto the cover glass substrate. In embodiments, the anti-glare surface includes an etched surface. In embodiments, the anti-reflective surface includes a multi-layer coating. In embodiments, the easy-to-clean surface includes an oleophobic coating that imparts anti-fingerprint properties. In embodiments, the haptic surface includes a raised or recessed surface formed from depositing a polymer or glass material on the surface to provide a user with tactile feedback when touched.

In embodiments, a surface treatment (i.e., the easy-to-clean surface, the anti-glare surface, the anti-reflective surface, the haptic surface and/or the decorative surface) is disposed on at least a portion of the periphery of a major surface and the interior portion of the major surface is substantially free of the surface treatment.

Figure 4A:
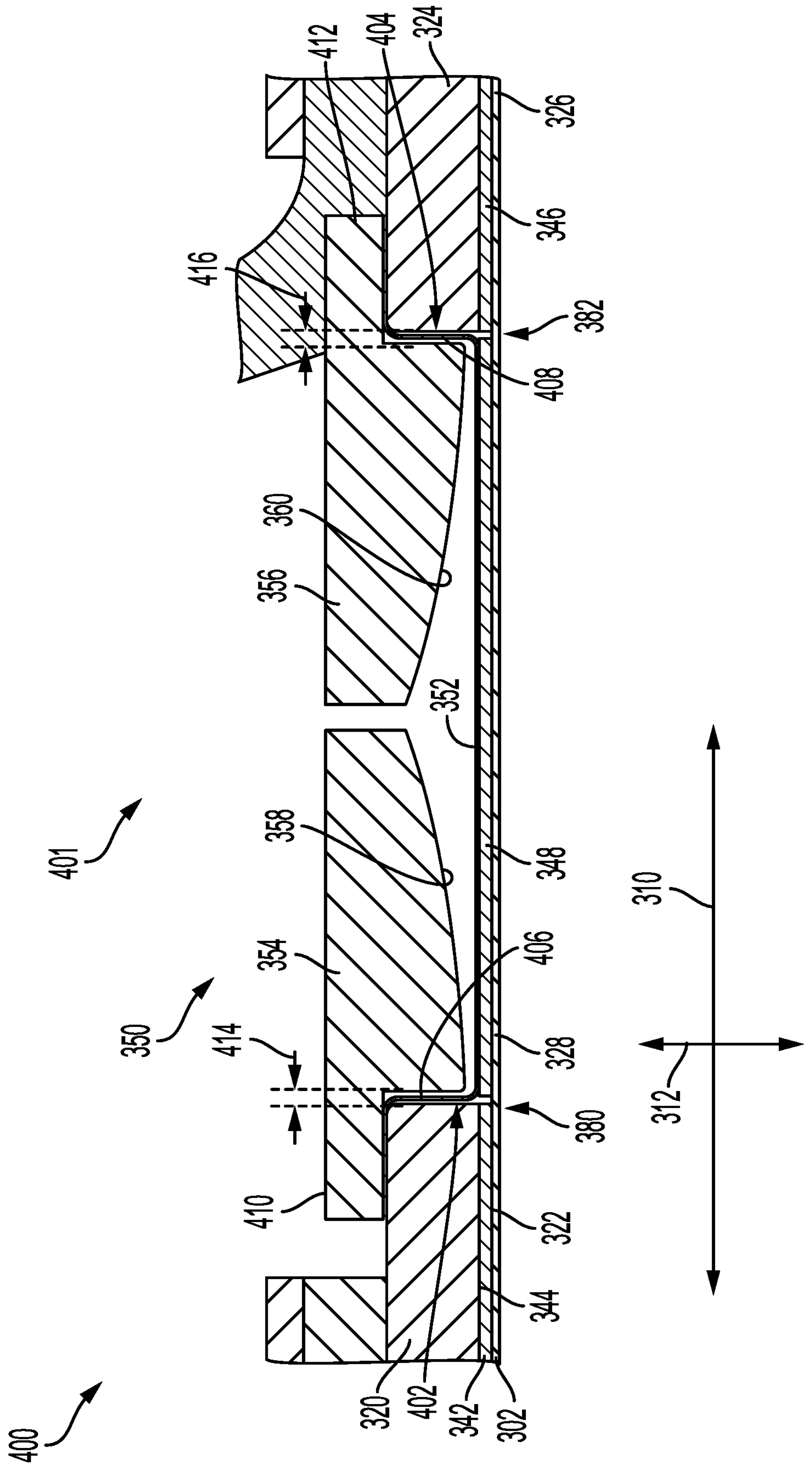
FIG. 4A schematically depicts a cross-sectional view of a portion of a support structure of a dynamically bendable automotive interior display system including two shear joints, according to one or more embodiments of the present disclosure.
Figure 4B:
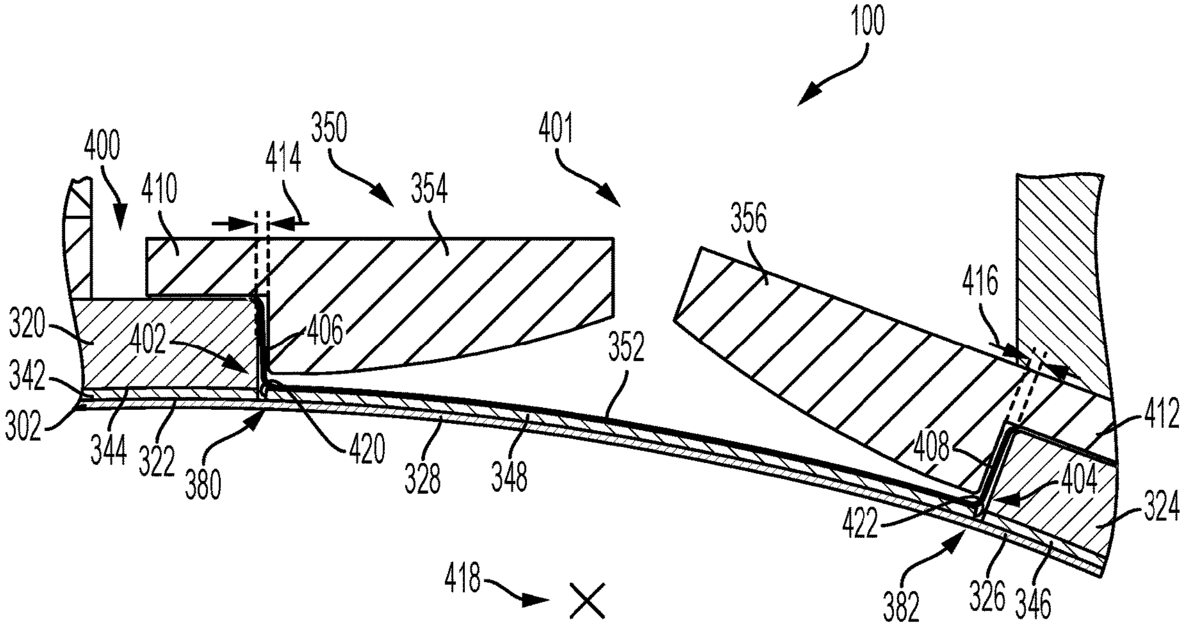
FIG. 4B schematically depicts a cross-sectional view of the dynamically bendable automotive interior display system of FIG. 4A with a cover substrate thereof being bent about a bending axis, according to one or more embodiments of the present disclosure.
Figure 4C:
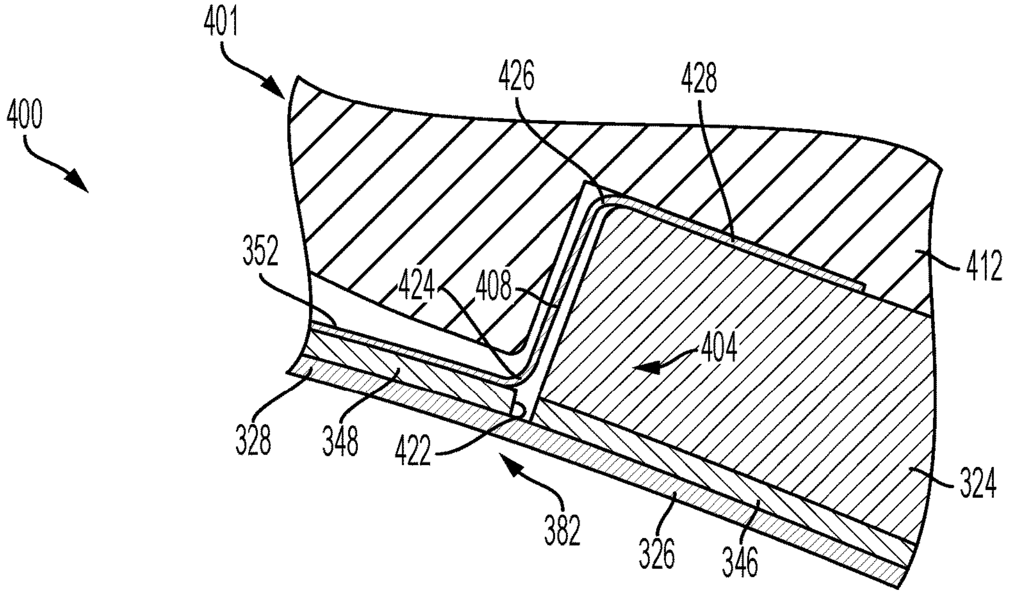
FIG. 4C schematically depicts a close-up view of one of the shear joints of the dynamically bendable automotive interior display system of FIG. 4A, according to one or more embodiments of the present disclosure.

Referring now to FIGS. 4A, 4B, and 4C, a display assembly 400 is depicted in cross section, according to an example embodiment of the present disclosure. The display assembly 400 may incorporate components that are similar to those of the display assembly 300 described above with respect to FIGS. 3A, 3B, and 3C. Accordingly, like reference numerals are used in FIGS. 4A, 4B, and 4C to indicate the incorporation of such like components. FIGS. 4A, 4B, and 4C depict cross-sectional views of a central portion of the display assembly 400 (e.g., corresponding to the central portion 305 of the display assembly 300 demarcated by the dash-dot lines in FIG. 3A), extending just outward of the first and second edges 338 and 340 of the dynamic bending portion 328 of the cover substrate 302. The undepicted portions of the display assembly 400 may be similar in structure to those depicted and described above with respect to FIGS. 3A-3C.

With reference to FIG. 4A, the display assembly 400 includes a support structure 401 attached to the cover substrate 302 using the adhesive layer 342 described herein with respect to FIGS. 3A, 3B, and 3C. The support structure 401 may include the first frame portion 320, the second frame portion 324, and the central portion 350 described above with respect to the display assembly 300. The first adhesive layer portion 344 is disposed between the first frame portion 320 and the first portion 322 of the cover substrate 302. The second adhesive layer portion 346 is disposed between the second frame portion 324 and the second portion 326 of the cover substrate 302. The third adhesive layer portion 348 is disposed between the central portion 350 and the dynamic bending portion 328 of the cover substrate 302. The first and second gaps 380 and 382, devoid of adhesive, are disposed between the first and third adhesive layer portions 344 and 348 and the second and third adhesive layer portions 346 and 348, respectively. The central portion 350 of the support structure 401 also includes the support mandrels 354 and 356 with the curved support surfaces 358 and 360 spaced apart from one another along the second axis 310 as well as the flexible support layer 352 along the third axis 312 for supporting the dynamic bending portion 328 in the event of external impacts, while still facilitating the dynamic bending portion 328 having the flexibility to reconfigure the display assembly 400 in terms of shape/viewing angle.

The display assembly 400 includes first and second shear joints 402 and 404 that differ in structure from the first and second shear joints 364 and 366 of the display assembly 300. The first shear joint 402 is depicted to include a first elastic member 406 extending between and connecting the flexible support layer 352 to the first frame portion 320. The second shear joint 404 is depicted to include a second elastic member 408 extending between and connecting the flexible support layer 352 to the second frame portion 324. The first and second elastic members 406 and 408 may be constructed of a suitable material possessing the requisite flexibility and flexural strength to facilitate retaining the components of the support structure 401 in a desired orientation as the display assembly 400 is adjusted in shape (e.g., so as to prevent twisting of the first and second frame portions 320 and 324 from one another about the second or third axis 310 and 312), while permitting at least the flexible support layer 352 to move relative to the first and second frame portions 320 as the dynamic bending portion 328 is bent about a bending axis 418 (see FIG. 4B). It should be understood that a variety of structures for the first and second elastic members 406 and 408 are contemplated and within the scope of the present disclosure. In embodiments, the first and second elastic members 406 and 408 may each include a plurality of separate components (e.g., spring members, sections of a suitable material such as a metal or alloy) distributed along the third axis 312 (see FIG. 3A) at each of the first and second shear joints 402 and 404.

FIG. 4C depicts a close-up view of the second shear joint 404. In the depicted embodiment, the first and second elastic members 406 and 408 (not depicted in FIG. 4C) are integrally formed with the flexible support layer 352. In this embodiment, the first and second elastic members 406 and 408 are extensions of the flexible support layer 352 that are bent about the third axis 312 to connect the first and second frame portions 320 and 324 to the central portion 350. For example, the as shown in FIG. 4C, the flexible support layer 352 includes a first bending region 424 where the flexible support layer 352 is bent away from the cover substrate 302 and a second bending region 426 where the flexible support layer 352 is bent again to extend parallel to the second frame portion 324 to attach to a surface of the second frame portion 324 opposite to the surface attached to the cover substrate 302. Such a structure may simplify construction of the display assembly 400 because the flexible support layer 352, first elastic member 406, and second elastic member 408 may be formed of a single sheet of suitable material (e.g., stainless steel). The depicted embodiment may also reduce the number of components needed to connect the first and second frame portions 320 and 324 to the central portion 350 by reducing the need for fasteners and the like as compared to the embodiment described herein with respect FIGS. 3A, 3B, and 3C. Moreover, by relying on the flexibility of the material of flexible support layer 352 to provide the degree of freedom as opposed to the sliding of the various components of the support structure 401 relative to one another (as in the display assembly 300 described herein), the structure of the depicted embodiment ay also provide improved reliability performance. Embodiments are also envisioned where the first and second elastic members 406 and 408 are constructed from different pieces of material from the flexible support layer 352 (e.g., of the same or different material composition).

Referring again to FIG. 4A, in the depicted embodiment, the support mandrel 356 includes a cantilevered portion 410 attached to the first frame portion 320 and the support mandrel 356 includes a cantilevered portion 412 attached to the second frame portion 324. The cantilevered portions 410 and 412 are attached to the first and second frame portions 320 and 324 via the first and second elastic members 406 and 408. In embodiments, the first and second elastic members 406 and 408 are attached to the first and second frame portions 320 and 324 and the support mandrels 354 and 356 via welding or other suitable attachment method (e.g., structural adhesive). As shown in FIG. 4A, the first and second cantilevered portions 410 and 412 include different cross-sectional shapes than the main bodies of the support mandrels 354 and 356 and include portions that extend inward from edges of the first and second frame portions 320 and 324 to form gaps 414 and 416 extending along the second axis 310 through which the first and second elastic members 406 and 408 extend.

The gaps 414 and 416 provide clearance for the first and second elastic members 406 and 408 to bend as the dynamic bending portion 328 is bent to change viewing configurations of the display assembly 400. As shown in FIGS. 4A and 4B, for example, when the configuration of the display assembly 400 is changed such that the dynamic bending portion 328 is curved with a suitable radius of curvature about the bending axis 418, the contraction of the flexible support layer 352 may pull portions of the first and second elastic members 406 and 408 inward towards the flexible support layer 352. By permitting freedom of movement of the first and second elastic members 406 and 408, the gaps 414 and 416 prevent bending stresses from the contraction of the flexible support layer 352 from being transferred to the first and second frame portions 320 and 324. The overall bending stresses that the first and second adhesive layer portions 344 and 346 are subjected to may be reduced by the incorporation of the gaps 414 and 416.

Referring to FIGS. 4B and 4C, the first and second gaps 380 and 382 of the adhesive layer 342 coincide (e.g., overlap along the first axis 308—see FIG. 3A) with the gaps 414 and 416. The first and second gaps 380 and 382 thus form continuous cavities in the display assembly 400 with the gaps 414 and 416. Such a structure may facilitate maximum adhesive coverage between the dynamic bending portion 328 and the flexible support layer 352, and between the first and second frame portions 320 and 324 and the first and second portions 322 and 326, while providing the shear stress distribution benefits described herein. However, embodiments are envisioned where the first and second gaps 380 and 382 do not overlap with the gaps 414 and 416. For example, the first and second gaps 380 and 382 may be disposed outward from the gaps 414 and 416 (e.g., such that the first and second gaps 380 and 382 overlap the first and second frame portions 320 and 324).

As shown in FIGS. 4B-4C, as a result of the contraction of the flexible support layer 352 during bending, the third adhesive layer portion 348 is subjected to shear stress from the different bending radii of the dynamic bending portion 328 and the flexible support layer 352. As a result of the shearing stresses, the edges 420 and 422 bend inward and are deformed. However, as shown in FIG. 4C, the second adhesive layer portion 346 is not deformed as a result of the bending. Because of the second shear joint 404, the second adhesive layer portion 346 may be free from bending-induced shear stresses and therefore subjected to lower overall shearing stresses during use of the display assembly 400 than implementations not including the shear joints described herein.

Figure 5:
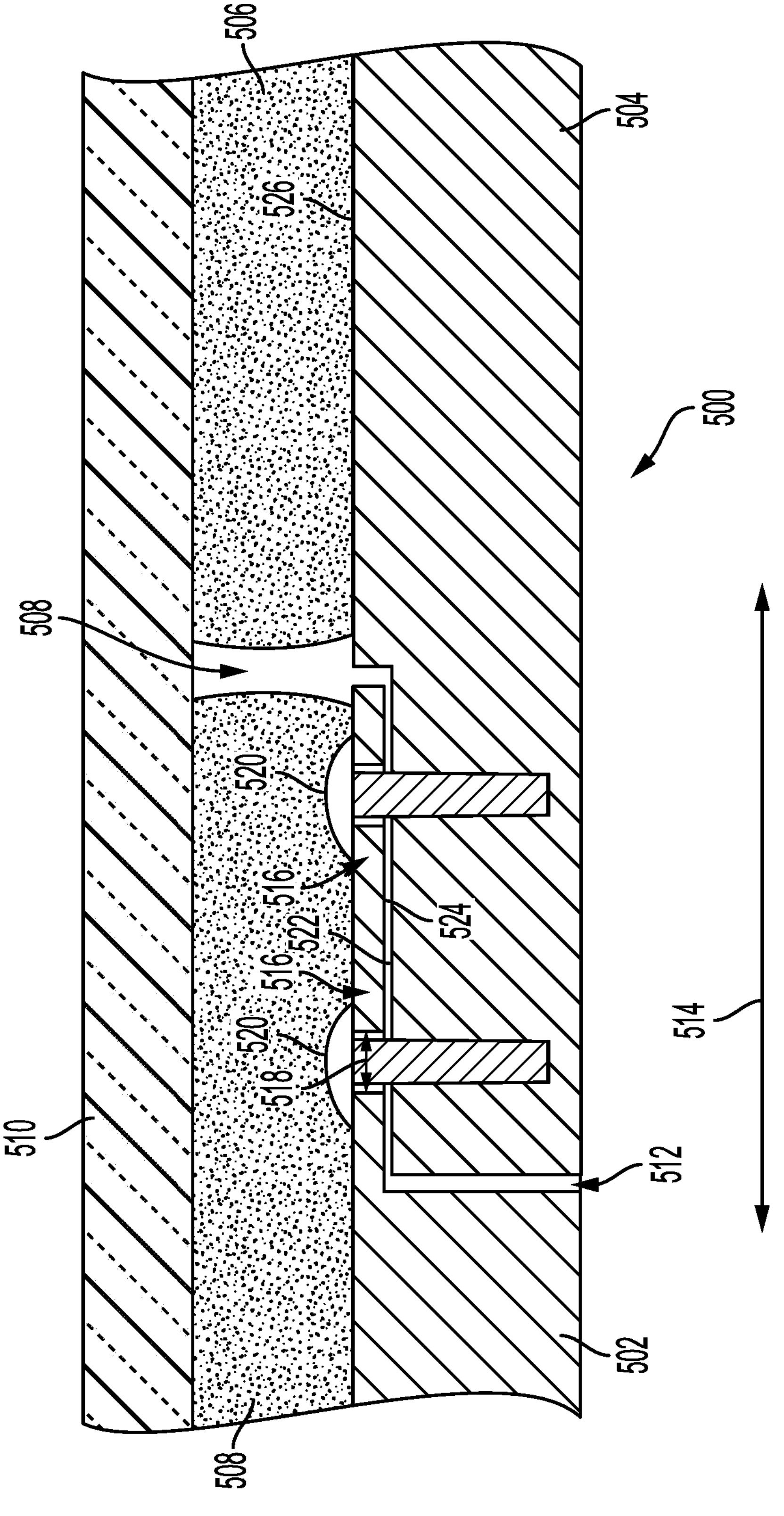
FIG. 5 schematically depicts a cross-sectional view of a shear joint coupling two portions of a support structure of an automotive interior display system to one another, according to one or more embodiments of the present disclosure.

FIG. 5 schematically depicts a shear joint 500 in cross section, according to an example embodiment of the present disclosure. The shear joint 500 provides a robust mechanical connection between two portions 502 and 504 of a frame or support structure for an automotive interior display, while permitting the portions 502 and 504 to move relative to one another along an axis 514 in response to thermal expansion or contraction of the components of the shear joint 500. The embodiment depicted in FIG. 5 may be employed in a portion of a support structure of an automotive interior display system that maintains a consistent shape throughout operation of the system. The portions 502 and 504 connected to one another via the shear joint 500 may be attached to a cover substrate 510 that does not dynamically bend during the operation of the system. That is the portion 502 and 504 may not bend relative to one another over the course of operating the system.

In embodiments, the shear joint 500 may be used in combination with the shear joints described herein with respect to FIGS. 3A-4C. For example, in embodiments, the shear joint 500 may be incorporated into one or more of the first frame portion 320 and the second frame portion 324. The shear joint 500 may connect sub-portions of the first frame portion 320 and the second frame portion 324 to one another. In such embodiments, the shear joint 500 may be designed to retain the first and second portions 322 and 326 (see FIG. 3A) of the cover substrate 302 in the first and second fixed shapes described herein, while permitting the sub-portions of the first frame portion 320 and/or the second frame portion 324 to move relative to one another along the second axis 310 (see FIG. 3A). In embodiments, the shear joint 500 may be disposed at the longitudinal edges 334 and 336 of the first and second frame portions 320 and 324 and connect sub-portions of the first and second frame portions 320 and 324 to one another. Such a construction may decouple the thermally-induced shear stress distributions in portions the adhesive layer 342 (see FIG. 3B) connecting each sub-portion to the cover substrate 302 from one another, lowering the maximum thermally-induced shear tress that each portion of the adhesive layer 342 subjected to. In an example, two of the shear joints 500 may be disposed at opposing longitudinal edges 314 of the cover substrate 302, such as in the regions 450 and 452 depicted in FIG. 3A. Such a structure may decouple the thermally-induced bending stress distributions in each sub-portion of the support structure 318 disposed on either side of the shear joints 500.

As shown in FIG. 5, a gap 507 separates a first adhesive layer portion 506 from a separate adhesive layer portion 508. The first adhesive layer portion 506 attaches the portion 504 to the cover substrate 510 and the second adhesive layer portion 508 attaches the portion 502 to the cover substrate 510. The gap 507 is disposed proximate to a gap 512 formed between the portions 502 and 504. The portion 502 includes openings 516 for receiving connection elements 520 (e.g., suitable fastening elements such as rivets) that secure the portions 502 and 504 to one another. The openings 516 include a dimension 518 that is greater than that of the connection elements 520 that is greater than that of the connection elements 520 so as to provide a longitudinal degree of freedom along the axis 514. The axis 514 may correspond to the second axis 310 described herein with respect to FIGS. 3A-4C. As such, the gap 512 may change in size/shape as the portions 502 and 504 thermally expand and contract. The gap 507 beneficially decouples the thermally-induced shear stresses in the first and second adhesive layer portions 506 and 508 from one another, lowering the L value in Equations 1 and 2 herein, limiting the maximum thermally-induced shear stress that the adhesive is subjected to.

In the embodiment depicted in FIG. 5, the portions 502 and 504 include surfaces 522 and 524 that extend along the axis 514. The connection elements 520 may retain the surfaces 522 and 524 in contact with one another as the portions 502 and 504 move relative to one another along the axis 514. Such a structure may beneficially aid in maintaining the cover substrate 510 in a desired fixed shape conforming with the surfaces 522 and 524, while still providing the degree of freedom. The surfaces 522 and 524 may correspond in shape (e.g., extend parallel to) the support surface 526 that the cover substrate 510 is adhered to. As a result, the shear joint 500 provides robust structural support to retain the cover substrate 510 in a desired fixed shape, while providing the portions 502 and 504 the degree of freedom to move relative to one another and lower the thermally-induced shear stresses in the adhesive.

In the event of inconsistent usages between this document and any documents so incorporated by reference, the usage in this document controls

EXAMPLES

Embodiments of the present disclosure may be understood in view of the following examples.

Figure 6:
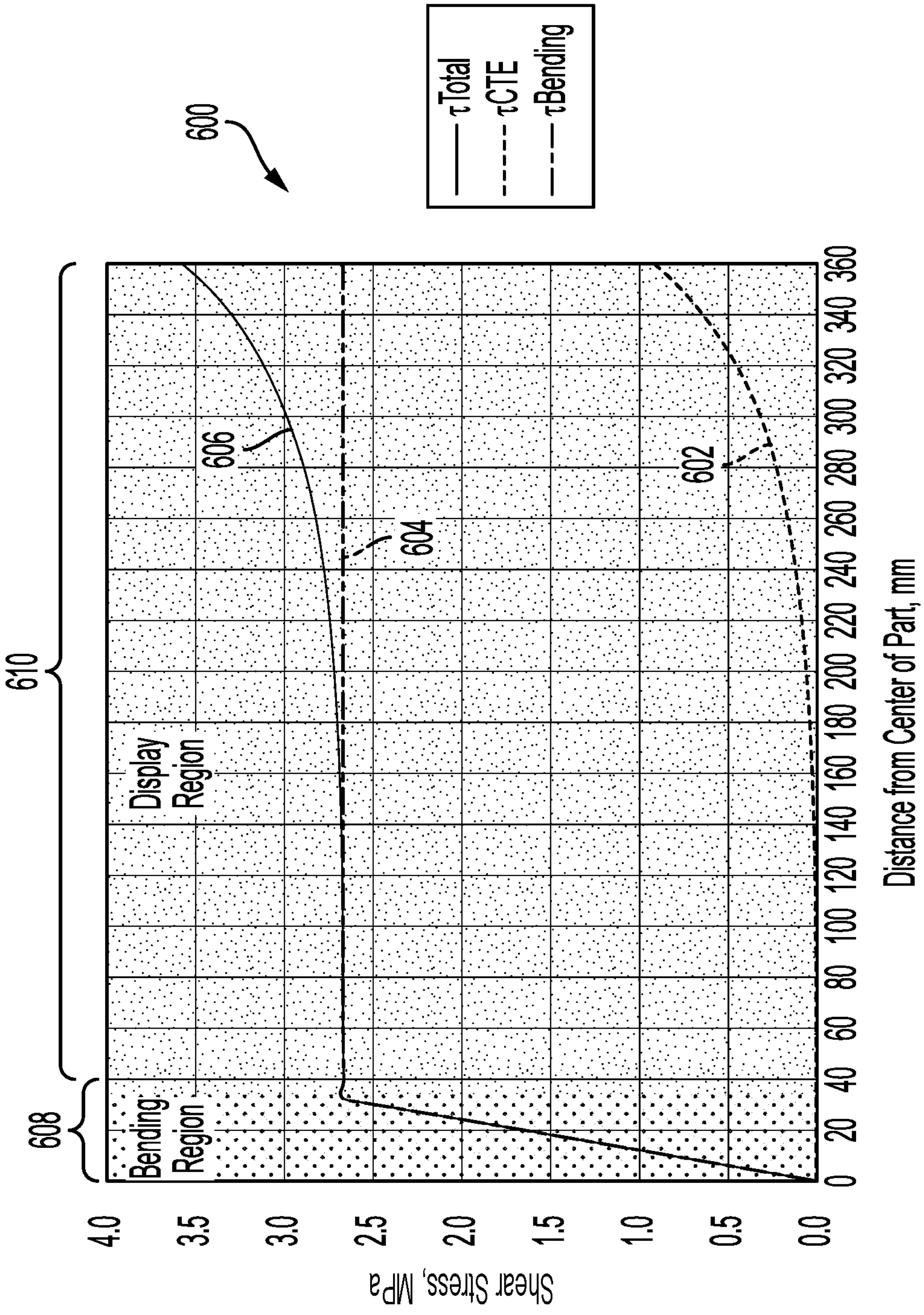
FIG. 6 is a plot of modelled thermally-induced and bending-induced shear stresses in an adhesive layer of a dynamically bendable automotive interior display system without shear joints, according to one or more embodiments of the present disclosure.

FIG. 6 depicts a plot 600 of modeled shear stresses in an adhesive layer attaching a support structure to a support structure including two frame portions that are bent relative to one another via a dynamic bending portion, as described herein. The following values were used to generate the plot 600 via Equations 1-4 herein:

$$\alpha_1 = 23.8E^{-6}\,1/°\text{C. (Aluminum)};$$

$$\alpha_2 = 7.88E^{-6}\,1/°\text{C. (glass)};$$

$$G = 3.054\text{ MPa};$$

$$L = 358\text{ mm}(1/2\text{ part length});$$

$$\Delta T = 63°\text{ C. } (23°\text{ C.} \rightarrow -40°\text{ C.});$$

$$H = 1\text{ mm(polyurethan adhesive)};$$

$$E_1 = 68.9\text{ GPa (frame)};$$

$$E_2 = 76.7\text{ GPa (glass)};$$

$$t_1 = 10\text{ mm (frame)};$$

$$t_2 = 0.7\text{ mm (glass); and}$$

$$\theta = 0.1745\text{ rad}(10°)(1/2\text{ of total bend}).$$

The plot 600 depicts results where the length L is 716 mm (see FIG. 3A), the cover substrate 302 is a 0.7 mm thick sheet of glass with a Young's modulus of 76.7 GPa, and the support structure 318 is a constant thickness (of 10 mm) aluminum frame. The adhesive was 1 mm thick and had a shear modulus of 3.054 MPa (a polyurethane adhesive). The first and second frame portions 320 and 324 were bent relative so as to extend 10° relative to one another.

A first curve 602 models the thermally-induced shear stress in the adhesive. A second curve 604 models the bending-induced shear stress in the adhesive. A third curve 606 models the combined bending-induced shear stress and thermally-induced shear stress. As shown, the glass had a dynamic bending portion 608 with a width of approximately 70 mm in this example (the plot 600 only depicts results for half the system). In the dynamic bending portion 608, the bending-induced shear stress linearly increases with increasing distance from the center of the system. In a fixed portion 610 (e.g., corresponding to one of the first and second frame portions 320 and 324 described herein) the thermally-induced shear stress combines with the maximum bending-induced shar stress such that the maximum shear stress in the adhesive is above 3.5 MPa at the edge of the part (corresponding to the transverse edges 316 depicted in FIG. 3C).

Figure 7:
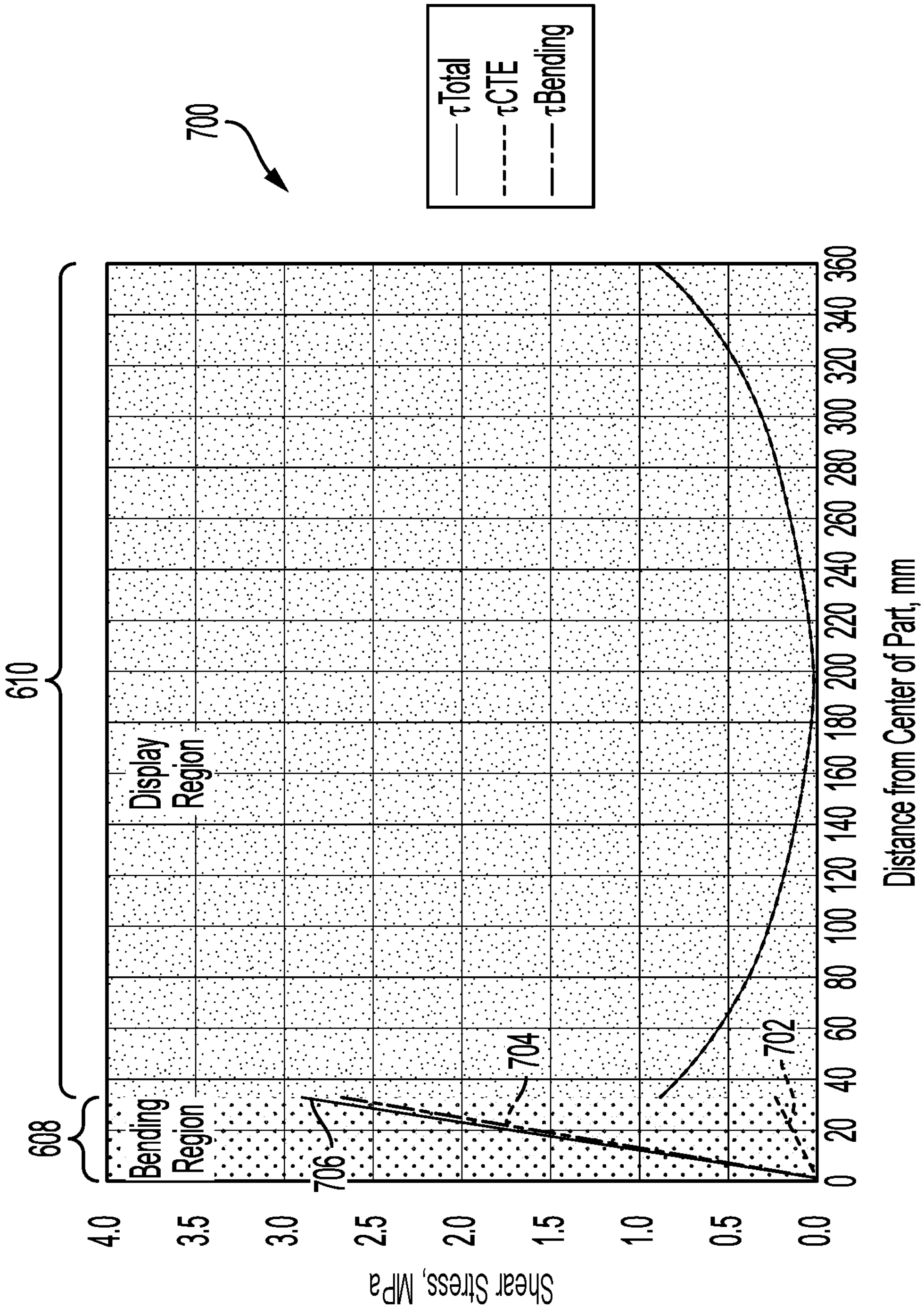
FIG. 7 is a plot of modelled thermally-induced and bending-induced shear stresses in an adhesive layer of a dynamically bendable automotive interior display system with shear joints, according to one or more embodiments of the present disclosure.

FIG. 7 depicts a plot 700 of an example constructed with similar material properties and dimensions as the example described with respect to FIG. 6. To generate the plot, shear joints (e.g., either the shear joints 364 and 366 or the shear joints 402 and 404 described herein), were provided at the edges of the dynamic bending portion 608. That is, gaps in the adhesive were provided at locations where different portions of the support structure were permitted to move relative to one another along the longitudinal axis (extending perpendicular to the bend axis about which the dynamic bending portion 608 was bent). A first curve 702 models the thermally-induced shear stress in the adhesive. A second curve 704 models the bending-induced shear stress in the adhesive. A third curve 706 models the combined bending-induced shear stress and thermally-induced shear stress. As a result of the shear joints, the bending-induced shear-stress is isolated in the dynamic bending portion 608 and does not combine with the thermally-induced shear stress in the fixed portion 610. Moreover, the L variable in Equations 1-2 is reduced by the shear joints, lowering the thermally-induced shear stress in each portion of the adhesive layer. As a result, the shear stress in the adhesive reaches a minimum value at the center of the center of the fixed portion 610, and the maximum shear stress at the edge of the fixed portion 610 is less than 1.0 MPa. The shear joints reduced the maximum shear stress in the fixed portion 610 my more than 66.67%, demonstrating the efficacy of the shear joints described herein at improving component reliability.

Figure 8:
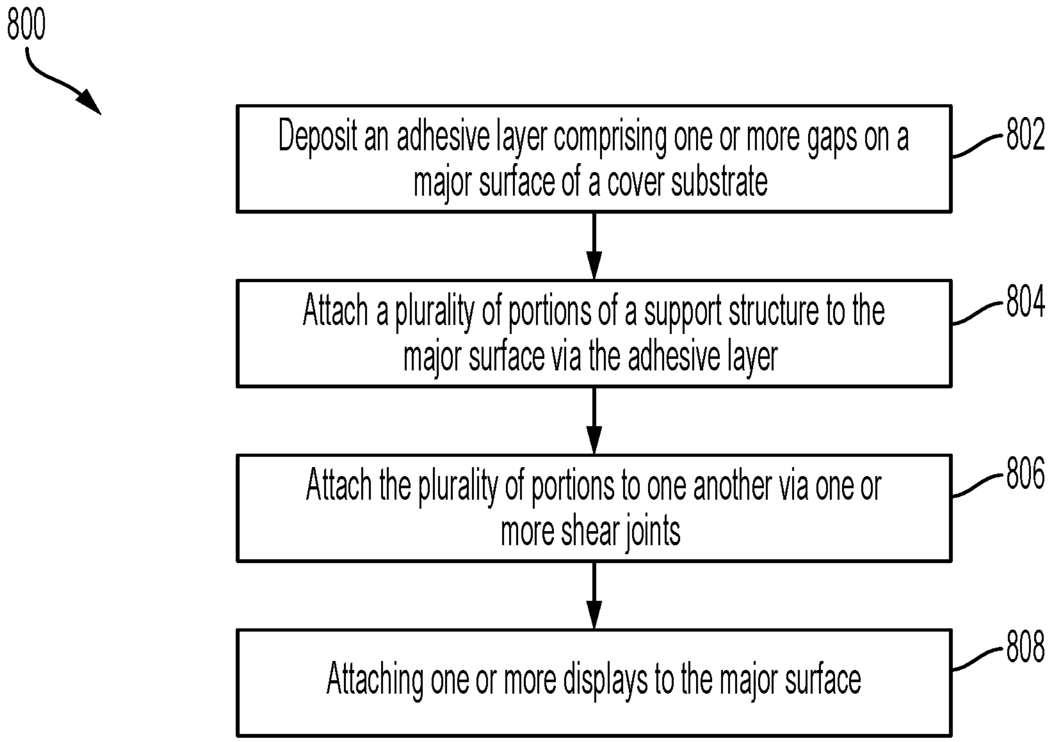
FIG. 8 is a flow diagram of a method of assembling a dynamically bendable automotive interior display system, according to one or more embodiments of the present disclosure.

Referring now to FIG. 8, a method 800 of assembling a display assembly for a vehicle interior system is depicted. The method 800 may be used to assemble any of the display assemblies (e.g., the display assembly 300 and the display assembly 400) described herein. The display assembly 400 described herein with respect to FIGS. 4A-4C will be used as an example to aid in the description of the method 800, though it should be appreciated that the method may be used to form any suitable display system.

At block 802, the method includes depositing the adhesive layer 342 onto the second major surface 306 of the cover substrate 302 such that the adhesive layer 342 includes the first and second gaps 380 and 382. In embodiments, one or more adhesive blocking structures (e.g., shims or the like) may be provided on the second major surface 306 in a suitable pattern prior to deposition of the adhesive onto the second major surface 306. The blocking structures may be removed after deposition of the adhesive to facilitate formation of the first and second gaps 380 and 382. In embodiments, the adhesive is applied uniformly onto the second major surface 306 and portions of the adhesive may be subsequently removed (e.g., chemically or mechanically) using a suitable technique to form the first and second gaps 380 and 382. In embodiments, the adhesive layer 342 uniformly covers the entirety of the second major surface 306, absent the first and second gaps 380 and 382. As a result of the first and second gaps 380 and 382, the adhesive layer 342 is divided into different sections (the first, second, and third adhesive layer portions 344, 346, and 348).

At block 804, a plurality of portions of the support structure 318 are attached to the second major surface 306 via the first, second, and third adhesive layer portions 344, 346, and 348. The first frame portion 320 is attached to the first portion 322 via the first adhesive layer portion 344. The second frame portion 324 is attached to the second frame portion 324 via the second adhesive layer portion 346. The central portion 350 (e.g., the flexible support layer 352) is attached to the dynamic bending portion 328 via the third adhesive layer portion 348. For example, the different portions of the support structure 318 may be aligned with desired regions of the second major surface 306, forced against the adhesive layer 342, and the adhesive may be subsequently cured (e.g., UV-cured, dried, heated) to bond the support structure 318 to the cover substrate 302. In embodiments, at least one of the portions of the support structure 318 may be shaped prior to attachment to the cover substrate 302 to facilitate forming shear joints. For example, the flexible support layer 352 may be bent (e.g., to form the first and second bending regions 424 and 426 depicted in FIG. 4C) to facilitate attachment with the first and second frame portions 320 and 324.

At block 806, the first frame portion 320 is attached to the central portion 350 via the first shear joint 402 and the second frame portion 324 is attached to the central portion 350 via the second shear joint 404. Extensions of the flexible support layer 352 are bonded to the first and second frame portions 320 and 324 to form the first and second shear joints 402 and 404 that provide mobility of the central portion 350 relative to the first and second frame portions 320 and 324 along the second axis 310. The manner with which the portions of the support structure 318 are connected to form shear joints may vary depending on the structure of the shear joints. For example, fasteners may extend through openings in one of the portions to connect them to one another, as described with respect to FIGS. 3A-3C.

At block 808, one or more displays (e.g., display panels including a touch panel, display electronics, and the like) may be attached to the second major surface 306. For example, in embodiments, first and second display electronics 106A and 106B (see FIGS. 2A-2B) may be attached directly to the first and second portions 322 and 326, respectively, by a layer of optically clear adhesive that is separate from the adhesive layer 342. The first and second frame portions 320 and 324 may define first and second apertures (not depicted) to render the first and second display electronics 106A and 106B viewable through the cover substrate 302 from the first major surface 304. The first and second frame portions 320 and 324 may define open regions where the cover substrate 302 is not adhered directly to the support structure 318 to facilitate viewing of the displays.

Embodiments of the present disclosure may be further understood in view of the following aspects.

A first aspect of the present disclosure includes a display assembly for an automotive interior, the display assembly comprising: a cover substrate comprising a first major surface and a second major surface opposite the first major surface; and a support structure comprising: a plurality of frame portions, each of the plurality of frame portions being adhered to a separate region of the second major surface via an adhesive layer to retain the cover substrate in a curved configuration that is different from a neutral state of the cover substrate; a shear joint coupling two of the plurality of frame portions to one another, the shear joint configured to maintain a mechanical connection between the two frame portions despite bending stresses being present in the cover substrate, while permitting the two frame portions to move relative to one another along at least a first axis; and a gap in the adhesive layer disposed proximate to the shear joint, the gap decoupling thermally-induced strain distributions of different segments of the adhesive layer from one another via the shear joint.

A second aspect of the present disclosure includes a display assembly according to the first aspect, wherein the cover substrate comprises: a first portion retained in a first fixed shape by a first frame portion of the plurality of frame portions; and a second portion retained in a second fixed shape by a second frame portion of the plurality of frame portions.

A third aspect of the present disclosure includes a display assembly according to any of the first through the second aspects, wherein the first fixed shape and the second fixed shape comprise planar sheets.

A fourth aspect of the present disclosure includes a display assembly according to any of the first through the third aspects, wherein: at least one of the first frame portion and the second frame portion comprises sub-portions that are separate components of the support structure, and the sub-portions of the at least one of the first frame portion and the second frame portion are connected to one another via the shear joint.

A fifth aspect of the present disclosure includes a display assembly according to any of the first through the fourth aspects, wherein the shear joint comprises a movable connection element that connects the sub-portions to one another, wherein at least a portion of the connection element is movable relative to at least one of the sub-portions so as to permit the sub-portions to be moved relative to one another by a distance along the first axis.

A sixth aspect of the present disclosure includes a display assembly according to any of the first through the fifth aspects, wherein: the connection element comprises a fastener extending through an opening in a first one of the sub-portions and into a second one of the sub-portions, and the opening has a size greater than the fastener such that the first sub-portion is movable relative to the second portion along the first axis.

A seventh aspect of the present disclosure includes a display assembly according to any of the first through the sixth aspects, wherein the cover substrate comprises a dynamic bending portion extending between the first frame portion and the second frame portion, the dynamic bending portion offset from the first frame portion and the second frame portion along the first axis.

An eighth aspect of the present disclosure includes a display assembly according to any of the first through the seventh aspects, wherein: the support structure comprises a central portion disposed between the first frame portion and the second frame portion, and the shear joint connects the central portion to at least one of the first frame portion and the second frame portion.

A ninth aspect of the present disclosure includes a display assembly according to any of the first through the eighth aspects, wherein: the central portion comprises a flexible support layer adhered to the dynamic bending portion via the adhesive layer, and the shear joint connects the flexible support layer to the first frame portion or the second frame portion.

A tenth aspect of the present disclosure includes a display assembly according to any of the first through the ninth aspects, wherein the shear joint comprises: a connection block bonded to the flexible support layer, and a connection element extending through an opening in the first frame portion or the second frame portion into the connection block, wherein the first frame portion or the second frame portion comprises a cavity through which the connection block extends, the cavity comprising a dimension along the first axis that is greater than a dimension of the connection block such that the central portion may move relative to the first frame portion or the second frame portion along the first axis.

An eleventh aspect of the present disclosure includes a display assembly according to any of the first through the tenth aspects, wherein the shear joint comprises an elastic member extending between the flexible support layer and the first frame portion or the second frame portion, the elastic member configured to bend in conjunction with the dynamic bending portion of the cover substrate to permit the flexible support layer to move relative to first frame portion or the second frame portion without any bending-induced shear stress being induced on a portion of the adhesive layer disposed between the first frame portion or the second frame portion and the cover substrate.

A twelfth aspect of the present disclosure includes a display assembly according to any of the first through the eleventh aspects, wherein the elastic portion comprises an extension of the flexible support layer that is not adhered to the cover substrate.

A thirteenth aspect of the present disclosure includes a display assembly according to any of the first through the twelfth aspects, wherein: the first frame portion or the second frame portion comprises a mandrel comprising a curved surface curving away frame the cover substrate with increasing distance from the first portion or the second portion of the cover substrate, and the mandrel is separated from the second major surface of the cover substrate.

A fourteenth aspect of the present disclosure includes a display assembly according to any of the first through the thirteenth aspects, wherein the elastic portion extends in a gap between the mandrel and an edge of a surface of the first frame portion or the second frame portion that is adhered to the second major surface.

A fifteenth aspect of the present disclosure includes a display assembly according to any of the first through the fourteenth aspects, wherein the gap in the adhesive layer coincides with the gap between the mandrel and the edge.

A sixteenth aspect of the present disclosure includes a display assembly according to any of the first through the fifteenth aspects, wherein the support structure comprises a first shear joint disposed at a first edge of the dynamic bending portion and a second shear joint disposed at a second edge of the dynamic bending portion.

A seventeenth aspect of the present disclosure includes a display assembly according to any of the first through the sixteenth aspects, further comprising an actuator coupled to the support structure and configured to manipulate the support structure between a first configuration and a second configuration, wherein, in the second configuration, the cover substrate is bent to a smaller radius of curvature than in the first configuration.

An eighteenth aspect of the present disclosure includes a display assembly according to any of the first through the seventeenth aspects, wherein the cover substrate comprises a chemically strengthened glass.

A nineteenth aspect of the present disclosure includes a display assembly according to any of the first through the eighteenth aspects, wherein a display is attached to the second major surface within an aperture defined by the support structure.

A twentieth aspect of the present disclosure includes a display assembly for an automotive interior, the display assembly comprising: a cover substrate comprising a first major surface and a second major surface opposite the first major surface; a support structure comprising: a frame attached to the second major surface of the cover substrate via an adhesive layer, the frame comprising: a first frame portion adhered to a first portion of the cover substrate and retaining the first portion in a first fixed shape; and a second frame portion adhered to a second portion of the cover substrate and retaining the second portion in a second fixed shape, wherein the cover substrate comprises a dynamically bending portion extending between the first frame portion and the second frame portion; a central portion attached to the second major surface at a dynamic bending portion of the cover substrate; a first shear joint connecting a first edge of the central portion to the first frame portion, the first shear joint permitting the central portion to move along a first axis relative to the first frame portion while maintaining a connection between the first frame portion and the central portion as the cover substrate is bent in the dynamic bending portion; a second shear joint connecting a second edge of the central portion to the second frame portion, the second shear joint permitting the central portion to move along the first axis relative to the second frame portion while maintaining a connection between the second frame portion and the central portion as the cover substrate is bent in the dynamic bending portion; and an actuator assembly configured to move the first frame portion relative to the second frame portion to bend the cover substrate in the dynamic bending portion.

A twenty first aspect of the present disclosure includes a display assembly according to the twentieth aspect, wherein: the central portion comprises a flexible support layer adhered to the dynamic bending portion via the adhesive layer, and the first and second shear joints connect the flexible support layer to the first frame portion and the second frame portion, respectively.

A twenty second aspect of the present disclosure includes a display assembly according to any of the twentieth through the twenty first aspects, wherein each of the first and second shear joints comprise: a connection block bonded to the flexible support layer, and a connection element extending through an opening in the first frame portion or the second frame portion into the connection block, wherein the first frame portion or the second frame portion comprises a cavity through which the connection block extends, the cavity comprising a dimension along the first axis that is greater than a dimension of the connection block such that the central portion may move relative to the first frame portion or the second frame portion along the first axis.

A twenty third aspect of the present disclosure includes a display assembly according to any of the twentieth through the twenty second aspects, wherein the first shear joint and the second shear joint each comprise an elastic member extending between the flexible support layer and the first frame portion or the second frame portion, the elastic member configured to bend in conjunction with the dynamic bending portion of the cover substrate to permit the flexible support layer to move relative to first frame portion or the second frame portion without any bending-induced shear stress being induced on a portion of the adhesive layer disposed between the first frame portion or the second frame portion and the cover substrate.

A twenty fourth aspect of the present disclosure includes a display assembly according to any of the twentieth through the twenty third aspects, wherein the elastic portion comprises an extension of the flexible support layer that is not adhered to the cover substrate.

A twenty fifth aspect of the present disclosure includes a display assembly according to any of the twentieth through the twenty fourth aspects, wherein: at least one of the first frame portion and the second frame portion comprises a mandrel comprising a curved surface curving away from the cover substrate with increasing distance from the first portion or the second portion of the cover substrate, and the mandrel is separated from the second major surface of the cover substrate.

A twenty sixth aspect of the present disclosure includes a display assembly according to any of the twentieth through the twenty fifth aspects, wherein the elastic portion extends in a gap between the mandrel and an edge of a surface of the first frame portion or the second frame portion that is adhered to the second major surface.

A twenty seventh aspect of the present disclosure includes a display assembly according to any of the twentieth through the twenty sixth aspects, wherein the adhesive layer comprises gaps disposed proximate to the first and second shear joints.

A twenty eighth aspect of the present disclosure includes a display assembly according to any of the twentieth through the twenty seventh aspects, further comprising an actuator coupled to the support structure and configured to manipulate the support structure between a first configuration and a second configuration, wherein, in the second configuration, the cover substrate is bent to a smaller radius of curvature than in the first configuration.

A twenty ninth aspect of the present disclosure includes a display assembly according to any of the twentieth through the twenty eighth aspects, wherein the cover substrate comprises a chemically strengthened glass.

A thirtieth aspect of the present disclosure includes a display assembly according to any of the twentieth through the twenty ninth aspects, further comprising a first display adhered to the first portion of the cover substrate and a second display adhered to the second portion of the cover substrate, wherein the first and second displays are visible through the first and second frame portions when the display assembly is viewed from the first major surface.

A thirty first aspect of the present disclosure includes a method of assembling a display assembly for a vehicle interior system, the method comprising: depositing an adhesive layer onto a major surface of a cover substrate such that the adhesive layer comprises one or more gaps separating different sections of the adhesive layer; attaching a plurality of portions of a support structure to the major surface via the different sections of the adhesive layer, wherein the plurality of portions of the support structure comprises a first frame portion adhered to a first portion of the cover substrate and configured to retain the first portion of the cover substrate in a first fixed shape and a central portion adhered to a dynamic bending portion of the glass substrate; and attaching the first frame portion to the central portion via a shear joint, the shear joint being configured to maintain a connection between the first frame portion and the central portion while the dynamic bending portion is bent relative to the first portion, while permitting the first frame portion to move relative to the central portion in at least a first direction.

A thirty second aspect of the present disclosure includes a method according to the thirty first aspect, wherein a gap of the one or more gaps in the adhesive layer is disposed proximate to the shear joint.

A thirty third aspect of the present disclosure includes a display assembly according to any of the twentieth through the thirty second aspects, further comprising coupling the support structure to an actuator configured to move the dynamic bending portion relative to the first portion by bending the cover substrate.

A thirty fourth aspect of the present disclosure includes a display assembly according to any of the twentieth through the thirty third aspects, further comprising attaching the central portion to a second frame portion adhered to a second portion of the cover substrate via a second shear joint configured to maintain a connection between the second frame portion and the central portion while the dynamic bending portion is bent relative to the second portion.

A thirty fifth aspect of the present disclosure includes a display assembly according to any of the twentieth through the thirty fourth aspects, wherein the central portion comprises a flexible support layer adhered to the major surface at the dynamic bending portion.

A thirty sixth aspect of the present disclosure includes a display assembly according to any of the twentieth through the thirty fifth aspects, wherein the shear joint comprises: a connection block bonded to the flexible support layer and disposed in a cavity in the first frame portion; and a connection element extending through an opening in the first frame portion into the cavity, wherein the cavity comprises a dimension in the first direction that is greater than that of the connection block such that the connection block moves in the cavity as the dynamic bending portion is bent.

A thirty seventh aspect of the present disclosure includes a display assembly according to any of the twentieth through the thirty sixth aspects, wherein the shear joint comprises an elastic member extending from the flexible support layer and bonded to the first frame portion, wherein the flexible member bends in conjunction with the dynamic bending portion to decouple bending-induced shear stress in the different segments of the adhesive layer.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. Itis submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

We claim:

1. A display assembly for an automotive interior, the display assembly comprising:

a cover substrate comprising a first major surface and a second major surface opposite the first major surface; and a support structure comprising:

a plurality of frame portions, each of the plurality of frame portions being adhered to a separate region of the second major surface via an adhesive layer to retain the cover substrate in a curved configuration that is different from a neutral state of the cover substrate;

a shear joint coupling two of the plurality of frame portions to one another, the shear joint configured to maintain a mechanical connection between the two frame portions despite bending stresses being present in the cover substrate, while permitting the two frame portions to move relative to one another along at least a first axis; and a gap in the adhesive layer disposed proximate to the shear joint, the gap decoupling thermally-induced strain distributions of different segments of the adhesive layer from one another via the shear joint;

wherein the cover substrate comprises (i) a first portion retained in a first fixed shape by a first frame portion of the plurality of frame portions and (ii) a second portion retained in a second fixed shape by a second frame portion of the plurality of frame portions; and wherein at least one of the first frame portion and the second frame portion comprises sub-portions that are separate components of the support structure, and the sub-portions of the at least one of the first frame portion and the second frame portion are connected to one another via the shear joint.

2. The display assembly according to claim 1, wherein the first fixed shape and the second fixed shape comprise planar sheets.

3. The display assembly according to claim 1, wherein the shear joint comprises a movable connection element that connects the sub-portions to one another, wherein at least a portion of the connection element is movable relative to at least one of the sub-portions so as to permit the sub-portions to be moved relative to one another by a distance along the first axis.

4. The display assembly according to claim 3, wherein:

the connection element comprises a fastener extending through an opening in a first one of the sub-portions and into a second one of the sub-portions, and the opening has a size greater than the fastener such that the first sub-portion is movable relative to the second portion along the first axis.

5. The display assembly according to claim 1, where the cover substrate comprises a dynamic bending portion extending between the first frame portion and the second frame portion, the dynamic bending portion offset from the first frame portion and the second frame portion along the first axis.

6. The display assembly according to claim 5, wherein:

the support structure comprises a central portion disposed between the first frame portion and the second frame portion, and the shear joint connects the central portion to at least one of the first frame portion and the second frame portion.

7. The display assembly according to claim 1, further comprising an actuator coupled to the support structure and configured to manipulate the support structure between a first configuration and a second configuration, wherein, in the second configuration, the cover substrate is bent to a smaller radius of curvature than in the first configuration.

8. A display assembly for an automotive interior, comprising:

a cover substrate comprising a first major surface and a second major surface opposite the first major surface; and a support structure comprising:

a plurality of frame portions, each of the plurality of frame portions being adhered to a separate region of the second major surface via an adhesive layer to retain the cover substrate in a curved configuration that is different from a neutral state of the cover substrate;

a shear joint coupling two of the plurality of frame portions to one another, the shear joint configured to maintain a mechanical connection between the two frame portions despite bending stresses being present in the cover substrate, while permitting the two frame portions to move relative to one another along at least a first axis; and a gap in the adhesive layer disposed proximate to the shear joint, the gap decoupling thermally-induced strain distributions of different segments of the adhesive layer from one another via the shear joint;

wherein the cover substrate comprises (i) a first portion retained in a first fixed shape by a first frame portion of the plurality of frame portions and (ii) a second portion retained in a second fixed shape by a second frame portion of the plurality of frame portions;

wherein the cover substrate comprises a dynamic bending portion extending between the first frame portion and the second frame portion, the dynamic bending portion offset from the first frame portion and the second frame portion along the first axis;

wherein the support structure comprises a central portion disposed between the first frame portion and the second frame portion, and the shear joint connects the central portion to at least one of the first frame portion and the second frame portion; and wherein the central portion comprises a flexible support layer adhered to the dynamic bending portion via the adhesive layer, and the shear joint connects the flexible support layer to the first frame portion or the second frame portion.

9. The display assembly according to claim 8, wherein the shear joint comprises:

a connection block bonded to the flexible support layer, and a connection element extending through an opening in the first frame portion or the second frame portion into the connection block, wherein the first frame portion or the second frame portion comprises a cavity through which the connection block extends, the cavity comprising a dimension along the first axis that is greater than a dimension of the connection block such that the central portion may move relative to the first frame portion or the second frame portion along the first axis.

10. The display assembly according to claim 8, wherein the shear joint comprises an elastic member extending between the flexible support layer and the first frame portion or the second frame portion, the elastic member configured to bend in conjunction with the dynamic bending portion of the cover substrate to permit the flexible support layer to move relative to first frame portion or the second frame portion without any bending-induced shear stress being induced on a portion of the adhesive layer disposed between the first frame portion or the second frame portion and the cover substrate.

11. The display assembly according to claim 10, wherein the elastic portion comprises an extension of the flexible support layer that is not adhered to the cover substrate.

12. The display assembly according to claim 10, wherein:

the first frame portion or the second frame portion comprises a mandrel comprising a curved surface curving away frame the cover substrate with increasing distance from the first portion or the second portion of the cover substrate, and the mandrel is separated from the second major surface of the cover substrate.

13. The display assembly according to claim 12, wherein the elastic portion extends in a gap between the mandrel and an edge of a surface of the first frame portion or the second frame portion that is adhered to the second major surface.

14. The display assembly according to claim 13, wherein the gap in the adhesive layer coincides with the gap between the mandrel and the edge.

15. A display assembly for an automotive interior, the display assembly comprising:

a cover substrate comprising a first major surface and a second major surface opposite the first major surface;

a support structure comprising:

a frame attached to the second major surface of the cover substrate via an adhesive layer, the frame comprising:

a first frame portion adhered to a first portion of the cover substrate and retaining the first portion in a first fixed shape; and a second frame portion adhered to a second portion of the cover substrate and retaining the second portion in a second fixed shape, wherein the cover substrate comprises a dynamically bending portion extending between the first frame portion and the second frame portion;

a central portion attached to the second major surface at a dynamic bending portion of the cover substrate;

a first shear joint connecting a first edge of the central portion to the first frame portion, the first shear joint permitting the central portion to move along a first axis relative to the first frame portion while maintaining a connection between the first frame portion and the central portion as the cover substrate is bent in the dynamic bending portion;

a second shear joint connecting a second edge of the central portion to the second frame portion, the second shear joint permitting the central portion to move along the first axis relative to the second frame portion while maintaining a connection between the second frame portion and the central portion as the cover substrate is bent in the dynamic bending portion; and an actuator assembly configured to move the first frame portion relative to the second frame portion to bend the cover substrate in the dynamic bending portion, wherein the central portion comprises a flexible support layer adhered to the dynamic bending portion via the adhesive layer, and wherein the first and second shear joints connect the flexible support layer to the first frame portion and the second frame portion, respectively.

16. The display assembly according to claim 15, wherein each of the first and second shear joints comprise:

a connection block bonded to the flexible support layer, and a connection element extending through an opening in the first frame portion or the second frame portion into the connection block, wherein the first frame portion or the second frame portion comprises a cavity through which the connection block extends, the cavity comprising a dimension along the first axis that is greater than a dimension of the connection block such that the central portion may move relative to the first frame portion or the second frame portion along the first axis.

17. The display assembly according to claim 15, wherein the first shear joint and the second shear joint each comprise an elastic member extending between the flexible support layer and the first frame portion or the second frame portion, the elastic member configured to bend in conjunction with the dynamic bending portion of the cover substrate to permit the flexible support layer to move relative to first frame portion or the second frame portion without any bending-induced shear stress being induced on a portion of the adhesive layer disposed between the first frame portion or the second frame portion and the cover substrate.

* * * * *